(12) United States Patent
Minami et al.

(10) Patent No.: US 7,920,120 B2
(45) Date of Patent: Apr. 5, 2011

(54) DISPLAY DEVICE, DRIVING METHOD OF THE SAME AND ELECTRONIC EQUIPMENT HAVING THE SAME

(75) Inventors: Tetsuo Minami, Tokyo (JP); Katsuhide Uchino, Kanagawa (JP); Yukihito Iida, Kanagawa (JP)

(73) Assignee: Sony Corporation, Tokyo (JP)

( * ) Notice: Subject to any disclaimer, the term of this patent is extended or adjusted under 35 U.S.C. 154(b) by 708 days.

(21) Appl. No.: 12/010,147

(22) Filed: Jan. 22, 2008

(65) Prior Publication Data

US 2008/0180356 A1    Jul. 31, 2008

(30) Foreign Application Priority Data

Jan. 26, 2007 (JP) ................... 2007-015965
Feb. 2, 2007 (JP) ................... 2007-023892

(51) Int. Cl.
*G09G 3/36* (2006.01)
(52) U.S. Cl. ........................ 345/100; 345/204
(58) Field of Classification Search .......... 345/55, 345/76–78, 87, 94, 95, 98–100, 204–206, 345/208, 210, 214, 215
See application file for complete search history.

(56) References Cited

U.S. PATENT DOCUMENTS 6,392,627 B1 * 5/2002 Maekawa ............... 345/98
2006/0066531 A1 * 3/2006 Park et al. ............. 345/76

FOREIGN PATENT DOCUMENTS

JP    2006-133542    5/2006

* cited by examiner

*Primary Examiner* — Regina Liang
*Assistant Examiner* — Tom V Sheng
(74) *Attorney, Agent, or Firm* — Rader, Fishman & Grauer PLLC

(57) ABSTRACT

A pixel circuit of a display device of the present invention has a drive transistor which serves also as a transistor adapted to control the emission and non-emission periods of an organic EL element or other elements. A final stage buffer in an output circuit of a write scan circuit (WS) has its power supply separated from the power supply of circuit portions of a previous stage. In a first embodiment, a scan signal WS from the write scan circuit is activated instantaneously. In a second embodiment, the trailing edge of the scan signal WS falls slowly. This allows for writing of an input signal voltage in a stable manner.

9 Claims, 21 Drawing Sheets (A) THRESHOLD CORRECTION: NO
MOBILITY CORRECTION: NO (B) THRESHOLD CORRECTION: YES,
MOBILITY CORRECTION: NO (C) THRESHOLD CORRECTION: YES,
MOBILITY CORRECTION: YES

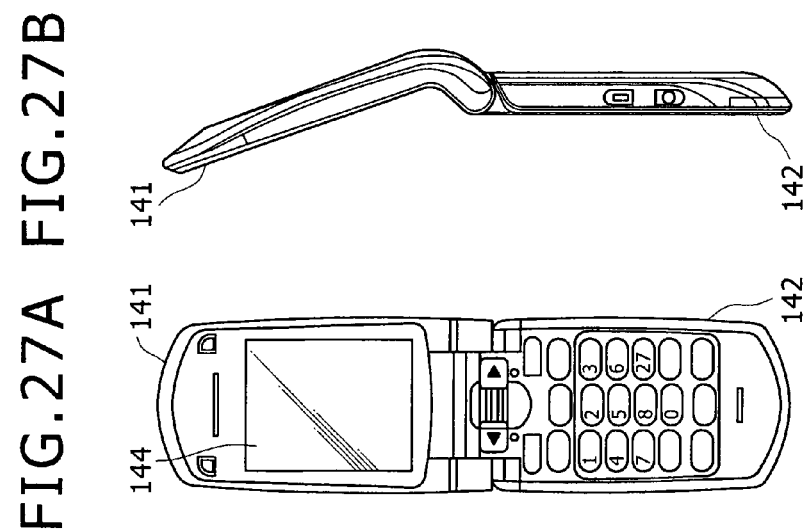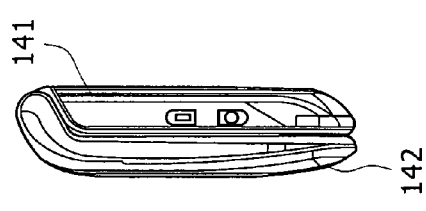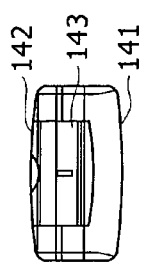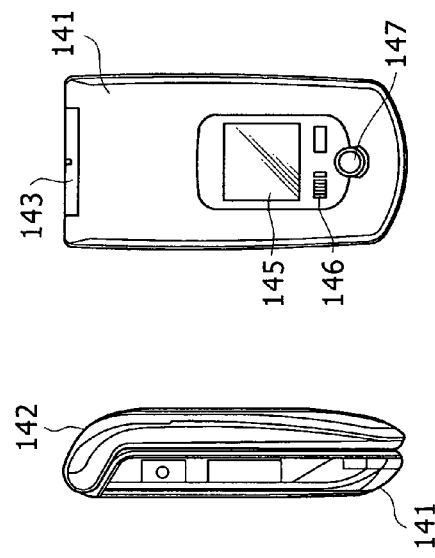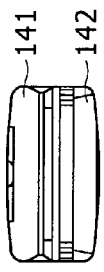

DISPLAY DEVICE, DRIVING METHOD OF THE SAME AND ELECTRONIC EQUIPMENT HAVING THE SAME

CROSS REFERENCES TO RELATED APPLICATIONS

The present invention contains subject matter related to Japanese Patent Application JP 2007-015965 filed in the Japan Patent Office on Jan. 26, 2007, and to Japanese Patent Application JP 2007-023892 filed in the Japan Patent Office on Feb. 2, 2007, the entire contents of which being incorporated herein by reference.

BACKGROUND OF THE INVENTION

1. Field of the Invention

The present invention relates to a display device, a driving method of the same and electronic equipment. The present invention relates particularly to a flat panel display device having pixels including electro-optical elements arranged in a matrix form, a driving method of the same and electronic equipment having the same.

2. Description of the Related Art

In the field of image display devices, recent years have seen the development and commercialization of flat panel display devices having pixels including light-emitting elements arranged in a matrix form. Among such display devices are organic EL display devices using organic EL (electro luminescence) elements as the light-emitting elements of the pixels. The organic EL element is an example of so-called current-driven electro-optical elements whose emission brightness changes with change in current flowing through the element. The organic EL element relies on the phenomenon that the organic thin film thereof emits light when an electric field is applied thereto.

Organic EL display devices offer low power consumption thanks to their organic EL elements which can be driven by an applied voltage of 10 V or less. Further, organic EL elements are self-luminous. This provides several advantages as compared to liquid crystal display devices designed to display an image by controlling the light intensity from the light source (backlight) for each pixel including a liquid crystal cell using the cell. Among such advantages are high image visibility, no need for backlights and high response speed of the elements.

As with liquid crystal display devices, organic EL display devices can be driven by passive or active matrix. It should be noted, however, that although passive matrix display devices are simple in structure, they have disadvantages including difficulties in implementing a large-size, high-definition display device. Therefore, the development of active matrix display devices has been brisk in recent years. In such display devices, the current flowing through the electro-optical element is controlled by an active element provided in the same pixel circuit such as insulated gate electric field effect transistor (generally TFT (Thin Film Transistor)).

Incidentally, the I-V characteristic (current vs voltage characteristic) of organic EL elements is generally known to deteriorate with time (so-called secular deterioration). In a pixel circuit using an N-channel TFT as a transistor adapted to drive an organic EL element (hereinafter described as "drive transistor") by a current, the organic EL element is connected to the source of the drive transistor. Therefore, secular deterioration of the I-V characteristic of the organic EL element leads to a change in a gate-to-source voltage Vgs of the drive transistor, thus changing the emission brightness of the organic EL element.

A more detailed description thereof will be given below. The source potential of a drive transistor is determined by the operating point of the drive transistor and the organic EL element. In the event of a deterioration of the I-V characteristic of the organic EL element, the operating point thereof changes. This leads to a change in the source potential of the drive transistor even if the same potential is applied to the gate of the drive transistor. As a result, the gate-to-source voltage Vgs of the drive transistor changes, changing the current flowing through the drive transistor. This changes the current flowing through the organic EL element, changing the emission brightness thereof.

With a pixel circuit using a polysilicon TFT, on the other hand, a threshold voltage Vth of the drive transistor and a mobility $\mu$ of the semiconductor thin film making up the channel of the drive transistor change with time in addition to the secular deterioration of the I-V characteristic of the organic EL element. Moreover, the threshold voltage Vth and the mobility $\mu$ may be different between different pixels due to a manufacturing process variation (that is, different transistors exhibit different characteristics). In the event of a difference in the threshold voltage Vth of the drive transistor or the mobility $\mu$, the current flowing through the drive transistor changes. This leads to a change in emission brightness of the organic EL element between different pixels even if the same voltage is applied to the gate of the drive transistor, thus impairing the uniformity over the screen.

For this reason, each of the pixel circuits has various compensation and correction functions to ensure that the emission brightness of the organic EL element remains constant even in the event of a secular deterioration of the I-V characteristic of the organic EL element or a secular change in the threshold voltage Vth or the mobility $\mu$ of the drive transistor (refer, for example, to Japanese Patent Laid-Open No. 2006-133542, which is hereinafter referred to as Patent Document 1). One of the functions is the compensation function adapted to compensate for the change in characteristic of the organic EL element. Another function is the correction function adapted to correct the change in the threshold voltage Vth of the drive transistor (hereinafter written as "threshold correction"). Still another function is the correction function adapted to correct the mobility $\mu$ of the drive transistor (hereinafter written as "mobility correction").

SUMMARY OF THE INVENTION

In the related art described in Patent Document 1, each pixel circuit has the compensation function adapted to compensate for the change in characteristic of the organic EL element and the correction functions adapted to correct the change in the threshold voltage Vth and the mobility $\mu$ of the drive transistor. As a result, the emission brightness of the organic EL element remains constant even in the event of a secular deterioration of the I-V characteristic of the organic EL element or a secular change in the threshold voltage Vth or the mobility $\mu$ of the drive transistor. However, each pixel circuit includes a large number of elements, thus posing a hurdle for the reduction of the pixel size.

A possible solution to reducing the number of elements and interconnections making up the pixel circuit would be to ensure that a supply potential supplied to the drive transistor of the pixel circuit can be changed. In this manner, the drive transistor would be capable of controlling the emission and non-emission periods of the organic EL element by changing the supply potential. As a result, the transistor adapted to control the emission and non-emission periods could be omitted.

This technique makes it possible to configure a pixel circuit with the minimum required number of elements. That is, a pixel circuit can be made up of a write transistor adapted to sample an input signal voltage and write the voltage to the pixel, a holding capacitance adapted to hold the input signal voltage written by the write transistor, and a drive transistor adapted to drive the electro-optical element based on the input signal voltage held by the holding capacitance.

As described above, if the drive transistor serves also as a transistor adapted to control the emission and non-emission periods of the organic EL element in order to reduce the number of elements making up the pixel circuit, the above mobility correction is carried out simultaneously with the writing of the input signal voltage by the write transistor. Incidentally, in the related art described in Patent Document 1, the mobility correction is performed after the write period of the input signal voltage is totally complete.

As described above, if the mobility correction is performed simultaneously with the writing of the input signal voltage, the mobility is corrected while the writing thereof is not totally complete. This leads to a variation of the mobility between different pixels, causing banding and degrading the image quality (details thereof will be described later).

On the other hand, the write transistor writes the input signal voltage by sampling the input signal voltage as a result of being driven by a write pulse. If the write pulse has a fast fall time (if the write pulse falls steeply), the gate potential of the drive transistor declines sharply as illustrated in FIG. 15 due to coupling when the write transistor turns off. The gate-to-source voltage Vgs of the drive transistor also declines (shrinks) with reduction of the gate potential thereof. As a result, the brightness declines as much as the reduction of the gate-to-source voltage Vgs.

In light of the foregoing, it is desirable to provide a display device capable of writing the input signal voltage and correcting the mobility in a stable manner, a driving method of the same and electronic equipment having the same.

It is also desirable to provide a display device capable of writing the input signal voltage in a stable manner while at the same time preventing the brightness being declined with the reduction of the gate-to-source voltage of the drive transistor due to coupling when the write transistor turns off, a driving method of the same and electronic equipment having the same.

In order to obtain the above-mentioned first display device, a display device according to an embodiment of the present invention includes a pixel array section and a scan circuit. The pixel array section includes pixels arranged in a matrix form. Each pixel includes an electro-optical element and a write transistor adapted to sample and write an input signal voltage. Each pixel further includes a holding capacitance adapted to hold the input signal voltage written by the write transistor and a drive transistor adapted to drive the electro-optical element based on the input signal voltage held by the holding capacitance. The scan circuit includes a final stage buffer. The scan circuit applies a scan signal from the buffer to the write transistor to select and scan the pixels in the pixel array section on a row by row basis. The power supply of the final stage buffer is separated from circuit portions of a previous stage. A supply voltage in pulse form is supplied to the power supply of the final stage buffer. As a result, the scan signal rises at the leading edge of the supply voltage.

In the display device configured as described above and electronic equipment having the same, the scan signal rises at the leading edge of the supply voltage in pulse form supplied to the power supply of the final stage buffer. The steep rise of the supply voltage makes it possible for the write transistor to quickly write the input signal voltage in response to the scan signal. This ensures that the mobility correction is performed after the writing of the input signal voltage is totally complete.

In order to obtain the above-mentioned second display device, a display device according to an embodiment of the present invention includes a pixel array section and a scan circuit. The pixel array section includes pixels arranged in a matrix form. Each pixel includes an electro-optical element and a write transistor adapted to sample and write an input signal voltage. Each pixel further includes a holding capacitance adapted to hold the input signal voltage written by the write transistor and a drive transistor adapted to drive the electro-optical element based on the input signal voltage held by the holding capacitance. The scan circuit includes a final stage buffer whose power supply is separated from circuit portions of a previous stage. The scan circuit applies a write pulse, which is based on an input pulse to the final stage buffer, to the write transistor to select and scan the pixels in the pixel array section on a row by row basis. A supply voltage, whose fall time is slower than that of the input pulse, is supplied to the power supply of the final stage buffer. As a result, the write pulse falls at the trailing edge of the supply voltage.

In the display device configured as described above and electronic equipment having the same, the supply voltage supplied to the power supply of the final stage buffer has a slower fall time than that of the input pulse to the final stage buffer. As a result, the write pulse from the final stage buffer is slower than that of the input pulse. That is, the write pulse falls slowly. This suppresses the reduction of the gate voltage of the drive transistor due to coupling when the write transistor turns off. As a result, the reduction of the gate-to-source voltage of the drive transistor can be suppressed.

BRIEF DESCRIPTION OF THE DRAWINGS

FIG. 24A is a perspective view as seen from the front of the camera, and FIG. 24B is a perspective view as seen from the rear thereof;

FIGS. 27A to 27G are perspective views illustrating a mobile phone to which an embodiment according to the present invention is applied, FIG. 27A is a front view of the mobile phone as opened, FIG. 27B is a side view thereof, FIG. 27C is a front view of the mobile phone as closed; FIG. 27D is a left side view, FIG. 27E is a right side view, FIG. 27F is a top view and FIG. 27G is a bottom view.

DETAILED DESCRIPTION OF THE PREFERRED EMBODIMENTS

The present invention performs the mobility correction after the writing of the input signal voltage is totally complete. This allows for writing of the input signal voltage and mobility correction in a stable manner, thus eliminating any variation of corrected mobility between different pixels and providing improved image quality.

The present invention also suppresses the reduction of the gate-to-source voltage of the drive transistor due to coupling when the write transistor turns off. This allows for writing of the input signal voltage in a stable manner while at the same time preventing the reduction of brightness resulting from the reduction of the gate-to-source voltage.

The preferred embodiments of the present invention will be described in detail below with reference to the accompanying drawings.

Figure 1:
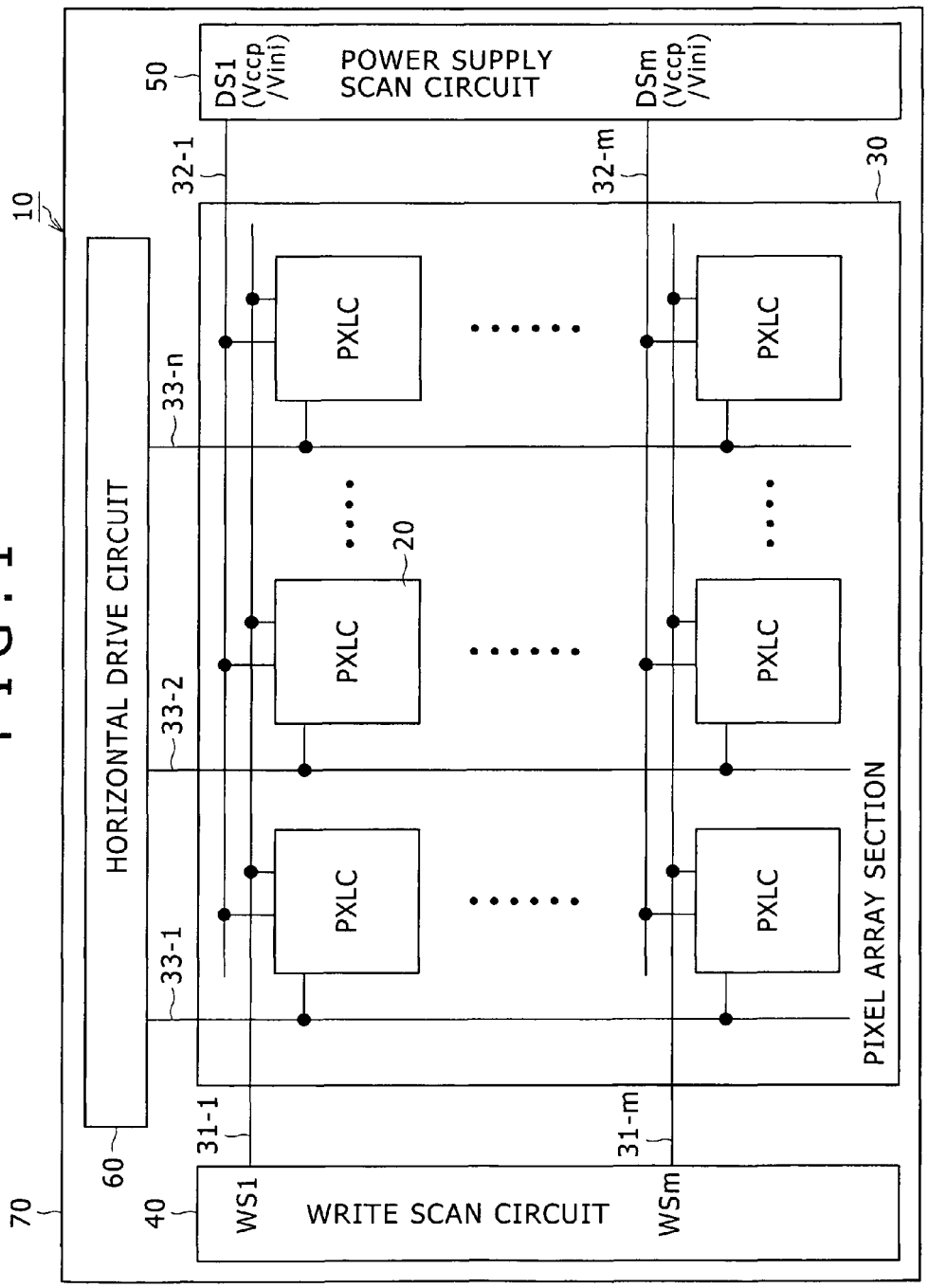
FIG. 1 is a system configuration diagram illustrating the schematic configuration of an organic EL display device according to an embodiment of the present invention.

FIG. 1 is a system configuration diagram illustrating the schematic configuration of an active matrix display device according to an embodiment of the present invention. Here, a description will be given, as an example, about an active matrix organic EL display device. This EL display device uses organic EL elements as light-emitting elements of pixels. The organic EL element is an example of so-called current-driven electro-optical elements whose emission brightness changes with change in current flowing through the element.

As illustrated in FIG. 1, an organic EL display device 10 according to the present embodiment includes a pixel array section 30 and drive sections disposed around the pixel array section 30 such as a write scan circuit 40, a power supply scan circuit 50 and a horizontal drive circuit 60. The pixel array section 30 has pixels (PXLC) 20 arranged two-dimensionally in a matrix form. The drive sections, namely, the write scan, power supply scan and horizontal drive circuits 40, 50 and 60 drive each of the pixels 20.

The pixel array section 30 has, in an m by n pixel array, scan lines 31-1 to 31-m and power supply lines 32-1 to 32-m, one each for each pixel row. The pixel array section 30 also has signal lines 33-1 to 33-n, one each for each pixel column.

The pixel array section 30 is normally formed on a transparent insulated substrate such as glass substrate and has a flat panel construction. Each of the pixels 20 of the same section 30 can be formed with amorphous silicon TFT (Thin Film Transistor) or low-temperature polysilicon TFT. When low-temperature polysilicon TFT is used, the write scan circuit 40, the power supply scan circuit 50 and the horizontal drive circuit 60 can also be incorporated on the display panel (substrate) on which the pixel array section 30 is formed.

The write scan circuit 40 includes a shift register or other components. To write a video signal to the pixels 20 of the pixel array section 30, the write scan circuit 40 supplies sequential scan signals WS1 to WSm to the scan lines 31-1 to 31-m to perform a linear sequential scan of the pixels 20 on a row by row basis.

The power supply scan circuit 50 includes a shift register or other components. The same circuit 50 supplies power supply line potentials DS1 to DSm to the power supply lines 32-1 to 32-m in synchronism with the linear sequential scan by the write scan circuit 40. The power supply line potentials DS1 to DSm switch between a first potential Vccp and a second potential Vini which is lower than the first potential Vccp. Here, the second potential Vini is sufficiently lower than an offset voltage Vofs applied by the horizontal drive circuit 60.

The horizontal drive circuit 60 selects either of a signal voltage Vsig of the video signal, commensurate with brightness information supplied by a signal supply source (not shown), and the offset voltage Vofs of the video signal as appropriate. Then, the same circuit 60 writes the selected voltage, for example, on a column by column basis, to the pixels 20 of each column of the pixel array section 30 all at once via the signal lines 33-1 to 33-n. That is, the same circuit 60 employs linear sequential driving adapted to write the video signal voltage Vsig, on a column by column (line by line) basis, to the pixels of each column all at once.

(Pixel Circuit)

Figure 2:
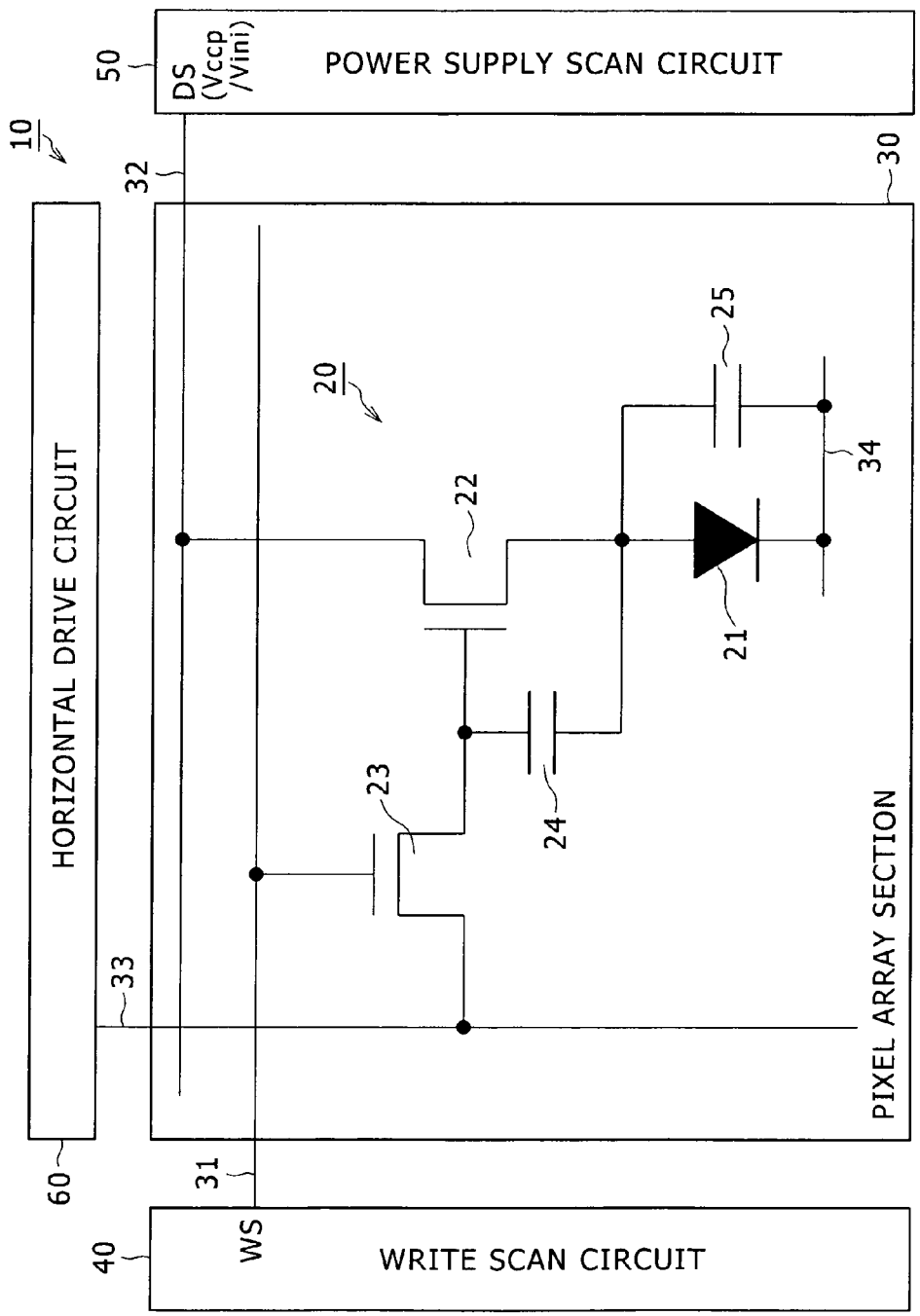
FIG. 2 is a circuit diagram illustrating a concrete configuration example of a pixel (pixel circuit)

FIG. 2 is a circuit diagram illustrating a concrete configuration example of the pixel (pixel circuit) 20. As illustrated in FIG. 2, the pixel circuit 20 includes an organic EL element 21 as a light-emitting element. The organic EL element is an example of so-called current-driven electro-optical elements whose emission brightness changes with change in current flowing through the elements. In addition to the organic EL element 21, the pixel circuit 20 includes a drive transistor 22, a write transistor 23, a holding capacitance 24 and an auxiliary capacitance 25.

Here, N-channel TFTs are used as the drive and write transistors 22 and 23. It should be noted, however, that the combination of conduction types of the drive and write transistors 22 and 23 given here is merely exemplary. The combination thereof is not limited to the above.

The organic EL element 21 has its cathode electrode connected to a common power supply line 34 which is shared by all the pixels 20. The drive transistor 22 has its source connected to the anode electrode of the organic EL element 21 and its drain to the power supply line 32 (any of 32-1 to 32-$m$).

The write transistor 23 has its gate connected to the scan line 31 (any of 31-1 to 31-$m$), its source to the signal line 33 (any of 33-1 to 33-$n$) and its drain to the gate of the drive transistor 22. The holding capacitance 24 has one of its ends connected to the gate of the drive transistor 22 and the other end to the source of the drive transistor 22 (anode electrode of the organic EL element 21).

The auxiliary capacitance 25 has one of its ends connected to the source of the drive transistor 22 and the other end to the cathode electrode of the organic EL element 21 (common power supply line 34). The auxiliary capacitance 25 is connected in parallel with the organic EL element 21, thus compensating for the lack of capacitance of the organic EL element 21. That is, the same capacitance 25 is not an absolutely necessary component, but instead may be omitted if the organic EL element 21 has sufficient capacitance.

In the pixel 20 configured as described above, the write transistor 23 conducts in response to the scan signal WS applied to its gate by the write scan circuit 40 via the scan line 31. As a result, the write transistor 23 samples either of the input signal voltage Vsig of the video signal, commensurate with brightness information, and the offset voltage Vofs of the video signal supplied by the horizontal drive circuit 60 via the signal line 33 and writes the selected voltage to the pixel 20. The written voltage, which is either the input signal voltage Vsig or the offset voltage Vofs, is held by the holding capacitance 24.

The drive transistor 22 is supplied with a current from the power supply line 32 (any of 32-1 to 32-$m$) when the potential DS of the same line 32 is at the first potential Vccp. As a result, the drive transistor 22 supplies a drive current, commensurate with the input signal voltage Vsig, to the organic EL element 21, thus driving the same element 21 with a current.

(Pixel Structure)

Figure 3:
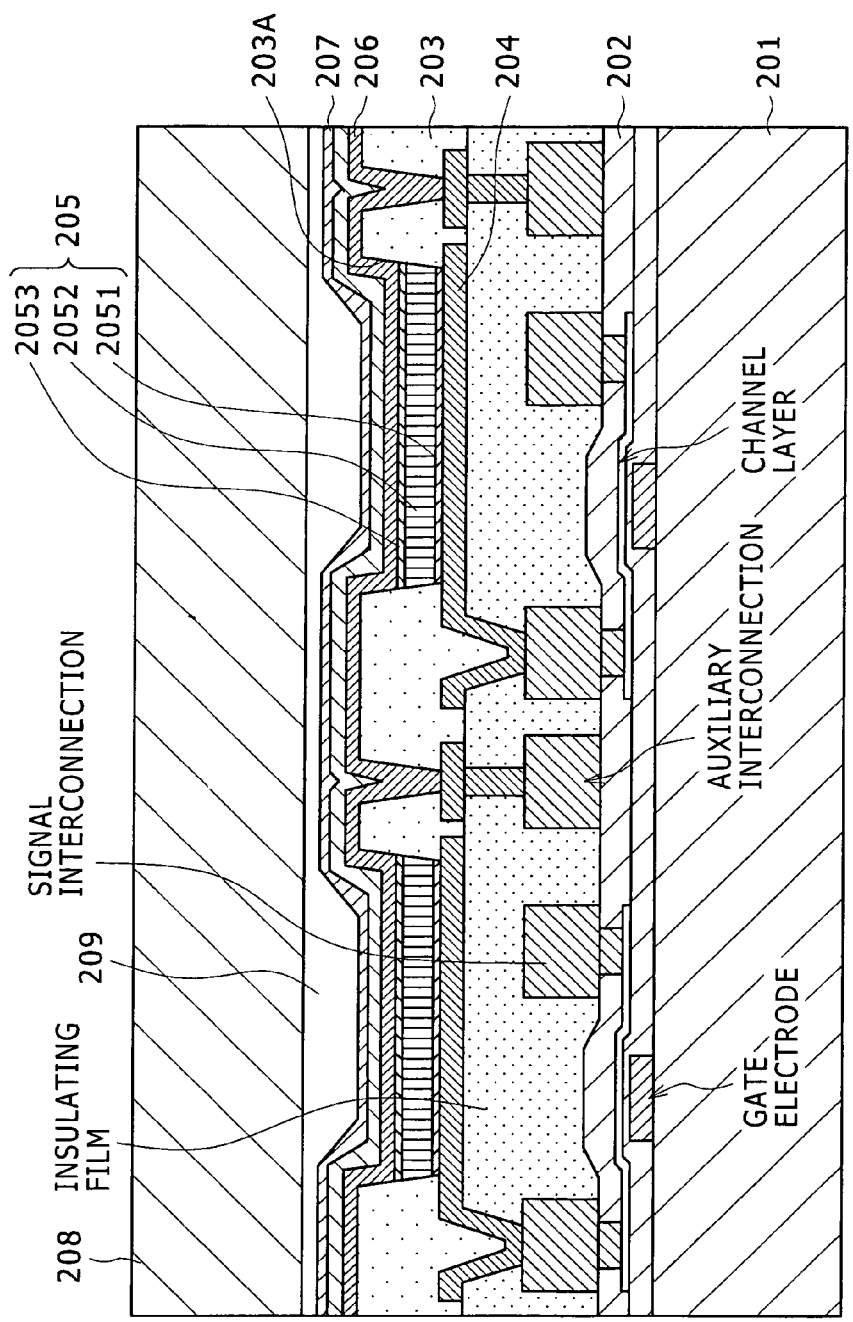
FIG. 3 is a sectional view illustrating an example of sectional structure of the pixel.

FIG. 3 illustrates an example of sectional structure of the pixel 20. As illustrated in FIG. 3, the pixel or pixel circuit 20 includes the drive and write transistors 22 and 23 and other components formed on a glass substrate 201. On top of the pixel circuit, an insulating film 202 and a window insulating film 203 are formed. The organic EL element 21 is provided in a recessed portion 203A of the window insulating film 203.

The organic EL element 21 includes an anode electrode 204, an organic layer (electron transport layer, light-emitting layer, hole transport/injection layer) 205 and a cathode electrode 206 formed on the organic layer 205 for all the pixels. The anode electrode 204 includes, for example, a metal formed on the bottom of the recessed portion 203A of the window insulating film 203. The cathode electrode 206 includes, for example, a transparent electroconductive film.

In the organic EL element 21, the organic layer 205 is formed by successively depositing a hole transport/injection layer 2051, a light-emitting layer 2052, an electron transport layer 2053 and an electron injection layer (not shown) on top of the anode electrode 204. As the organic EL element 21 is driven with a current by the drive transistor 22 illustrated in FIG. 2, a current flows from the drive transistor 22 to the organic layer 205 via the anode electrode 204. This causes electrons and holes to recombine in the light-emitting layer 2052 of the organic layer 205, thus allowing the organic EL element 21 to emit light.

As illustrated in FIG. 3, after the organic EL element 21 is formed for each pixel on the glass substrate 201 via the insulating film 202 and the window insulating film 203, a sealing substrate 208 is bonded to the organic EL element 21 via a passivation film 207 with an adhesive 209. A display panel 70 is formed as the organic EL element 21 is sealed by the sealing substrate 208.

(Threshold Correction Function)

Here, the power supply scan circuit 50 switches the potential DS of the power supply line 32 between the first and second potentials Vccp and Vini after the write transistor 23 conducts while the horizontal drive circuit 60 supplies the offset voltage Vofs to the signal line 33 (any of 33-1 to 33-$n$). This switching of the potential DS of the power supply line 32 ensures that a voltage corresponding to the threshold voltage Vth of the drive transistor 22 is held by the holding capacitance 24.

The voltage corresponding to the threshold voltage Vth of the drive transistor 22 is held by the holding capacitance 24 for the following reason. That is, the characteristics of the drive transistor 22 such as the threshold voltage Vth and the mobility $\mu$ may change between different pixels due, for example, to a manufacturing process variation or secular change. Such a change leads to a change in the drain-to-source current (drive current) Ids between different pixels even if the same potential is applied to the gates of all the drive transistors 22. This results in a variation of the emission brightness. The holding capacitance 24 holds the voltage corresponding to the threshold voltage Vth to cancel (correct) the impact of variation of the threshold voltage Vth between different pixels.

The threshold voltage Vth of the drive transistor 22 is corrected in the following manner. That is, the holding capacitance 24 holds the threshold voltage Vth in advance. As a result, when the drive transistor 22 is driven by the input signal voltage Vsig, the threshold voltage Vth of the drive transistor 22 is canceled by the voltage corresponding to the threshold voltage Vth held by the holding capacitance 24. In other words, the threshold voltage Vth is corrected.

The threshold correction function works as described above. This function maintains the emission brightness of the organic EL element 21 unchanged even in the event of a variation of the threshold voltage Vth between different pixels or secular change.

(Mobility Correction Function)

The pixel 20 illustrated in FIG. 2 has not only the aforementioned threshold correction function but also the mobility correction function. That is, the mobility is corrected to cancel the dependence of the drain-to-source current Ids of the drive transistor 22 on the mobility $\mu$ during a mobility correction period when the holding capacitance 24 holds the input signal voltage Vsig. The mobility correction period is a period of time during which the horizontal drive circuit 60 supplies the video signal voltage Vsig to the signal line 33 (any of 33-1 to 33-$n$) and during which the write transistor 23 conducts in response to the scan signal WS (any of WS1 to WSm) from the write scan circuit 40. The detailed principle and operation of the mobility correction will be described later.

(Bootstrap Function)

The pixel 20 illustrated in FIG. 2 further has the bootstrap function. That is, the horizontal drive circuit 60 stops supplying the scan signal WS (any of WS1 to WSm) to the scan line 31 (any of 31-1 to 31-$m$) when the holding capacitance 24 holds the input signal voltage Vsig. This causes the write transistor 23 to stop conducting, electrically separating the gate of the drive transistor 22 from the signal line 33 (any of 33-1 to 33-*n*). As a result, a gate potential Vg of the drive transistor 22 changes with change in a source potential Vs thereof. This maintains the gate-to-source voltage Vgs of the drive transistor 22 constant.

(Circuit Operation)

Next, a description will be given below about the circuit operation of the organic EL display device 10 according to the present embodiment based on the timing diagram shown in FIG. 4 and with reference to the explanatory diagrams shown in FIGS. 5A to 5D and 6A to 6D. It should be noted that the write transistor 23 is represented by a switch symbol in FIGS. 5A to 5D and 6A to 6D for simplification of the drawings. It should also be noted that the organic EL element 21 has a parasitic capacitance and that the parasitic capacitance and auxiliary capacitance 25 are represented by a combined capacitance Csub.

Figure 4:
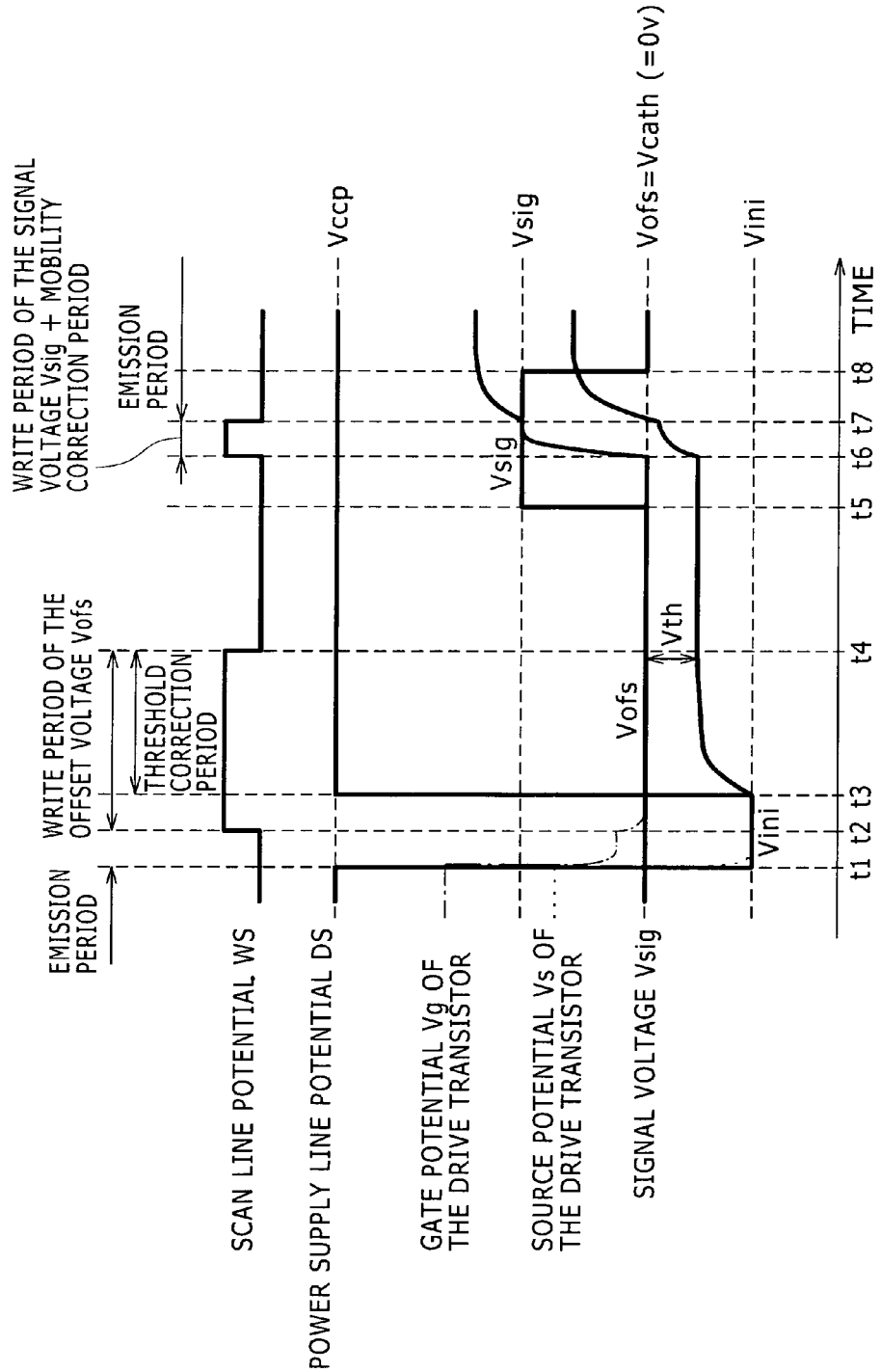
FIG. 4 is a timing diagram for describing the operation of the organic EL display device according to an embodiment of the present invention.

The timing diagram of FIG. 4 shows, on a common time axis, the changes of the potential (scan signal) WS of the scan line 31 (any of 31-1 to 31-*m*), the potential DS of the power supply line 32 (any of 32-1 to 32-*m*) and the gate and source potentials Vg and Vs of the drive transistor 22 for a period of 1 H (H represents the horizontal scan period). Up until time t2, the waveform of the potential (scan signal) WS of the scan line 31 is shown by a long dashed short dashed line, and that of the potential DS of the power supply line 32 by a dotted line for discrimination therebetween. From time t3 onward, both of the waveforms are shown by solid lines.

<Emission Period>

Figure 5A:
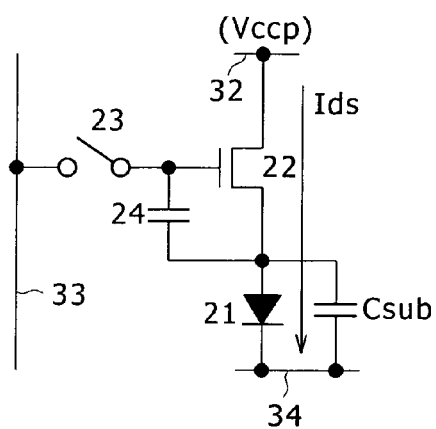
FIGS. 5A to 5D are explanatory diagrams (1) of the circuit operation of the organic EL display device according to an embodiment of the present invention.
Figure 5B:
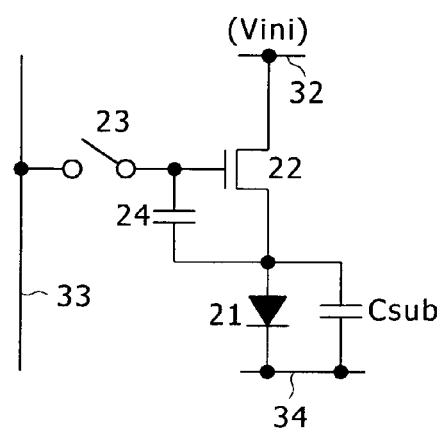

In the timing diagram of FIG. 4, the organic EL element 21 emits light before time t1 (emission period). During this emission period, the potential DS of the power supply line 32 is at the high potential Vccp (first potential). As illustrated in FIG. 5A, the drive current (drain-to-source current) Ids is supplied to the organic EL element 21 from the power supply line 32 via the drive transistor 22. As a result, the organic EL element 21 emits light at the brightness commensurate with the drive current Ids.

<Preparation Period for Threshold Correction>

At time t1, the linear sequential scan of a new field begins. When the potential DS of the power supply line 32 changes from the high potential Vccp to the low potential Vini (second potential) which is sufficiently lower than the offset voltage Vofs of the signal line 33, the source potential Vs of the drive transistor 22 also begins to drop to the low potential Vini.

Figure 5C:
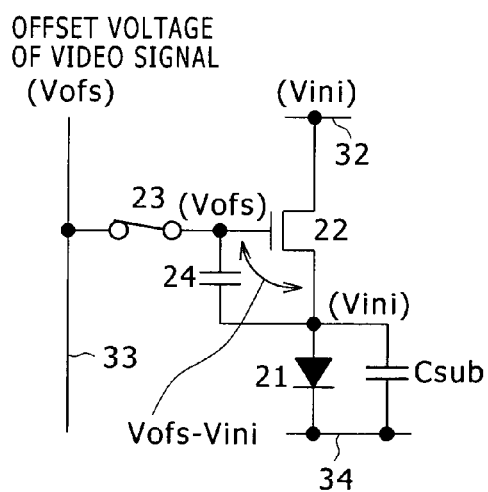

Next, the write scan circuit 40 outputs the scan signal WS at time t2, changing the potential WS of the scan line 31 to the high potential. As a result, the write transistor 23 starts conducting as illustrated in FIG. 5C. At this time, the horizontal drive circuit 60 supplies the offset voltage Vofs to the signal line 33. As a result, the gate potential Vg of the drive transistor 22 becomes equal to the offset voltage Vofs. On the other hand, the source potential Vs of the drive transistor 22 is at the low potential Vini which is sufficiently lower than the offset voltage Vofs.

Here, the low potential Vini is set so that the gate-to-source voltage Vgs of the drive transistor 22 is greater than the threshold voltage Vth of the same transistor 22. As described above, preparations for threshold voltage correction are complete when the gate and source potentials Vg and Vs of the drive transistor 22 are initialized respectively to the offset voltage Vofs and the low potential Vini.

<Threshold Correction Period>

Figure 5D:
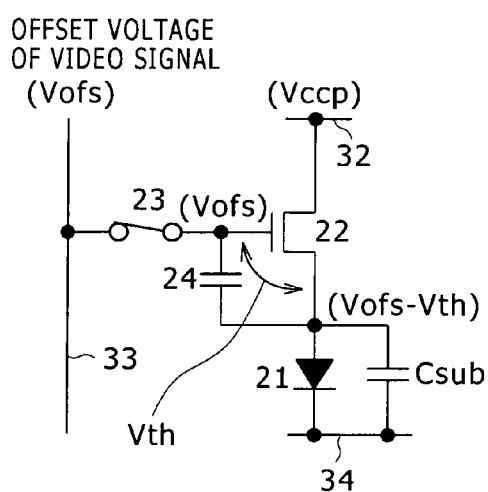

Next, when the potential DS of the power supply line 32 changes from the low potential Vini to the high potential Vccp at time t3 as illustrated in FIG. 5D, the source potential Vs of the drive transistor 22 begins to increase. The gate-to-source voltage Vgs of the drive transistor 22 will soon become equal to the threshold voltage Vth of the same transistor 22, causing the voltage corresponding to the threshold voltage Vth to be written to the holding capacitance 24.

Here, the period of time during which the voltage corresponding to the threshold voltage Vth is written to the holding capacitance 24 is referred to as a threshold correction period for reasons of convenience. It should be noted that, during the threshold correction period, a potential Vcath of the common power supply line 34 is set so as to bring the organic EL element 21 into a cutoff state. This is intended to ensure that all the current flows into the holding capacitance 24, and none into the organic EL element 21.

Figure 6A:
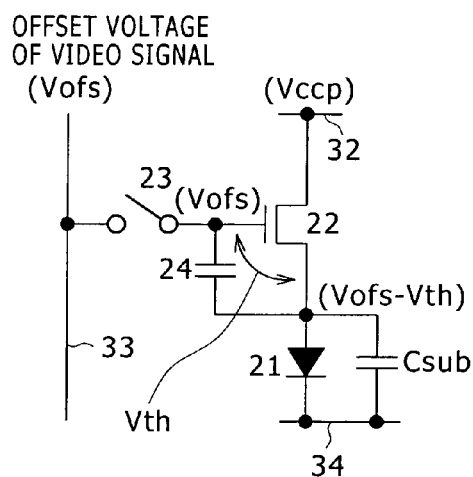
FIGS. 6A to 6D are explanatory diagrams (2) of the circuit operation of the organic EL display device according to an embodiment of the present invention.

Next, the potential WS of the scan line 31 changes to the low potential at time t4. As a result, the write transistor 23 stops conducting as illustrated in FIG. 6A. At this time, the gate of the drive transistor 22 is placed into a floating state. However, the gate-to-source voltage Vgs is equal to the threshold voltage vth of the drive transistor 22. As a result, the drive transistor 22 is in a cutoff state. Therefore, the drain-to-source current Ids does not flow.

<Write Period/Mobility Correction Period>

Figure 6B:
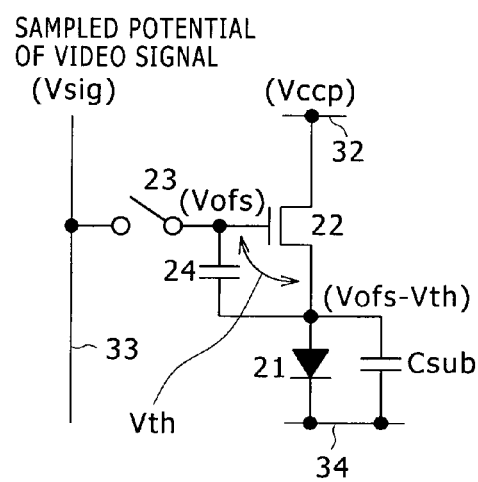
Figure 6C:
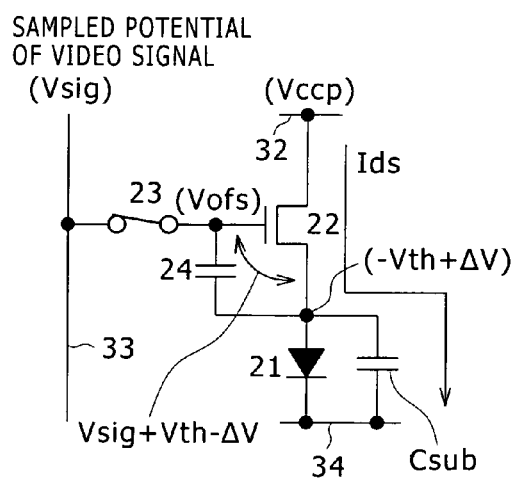

Next, the potential of the signal line 33 changes from the offset voltage Vofs to the signal voltage Vsig of the video signal at time t5 as illustrated in FIG. 6B. Then, the potential WS of the scan line 31 changes to the high potential at time t6. As a result, the write transistor 23 starts conducting as illustrated in FIG. 6C, sampling the signal voltage Vsig of the video signal.

As a result of the sampling of the input signal voltage Vsig by the write transistor 23, the gate potential Vg of the drive transistor 22 becomes equal to the input signal voltage Vsig. At this time, the organic EL element 21 is in a cutoff state (high-impedance state). Therefore, the drain-to-source current Ids of the drive transistor 22 flows into the combined capacitance Csub connected in parallel with the organic EL element 21, thus starting the charging of the combined capacitance Csub.

As the combined capacitance Csub is charged, the source potential Vs of the drive transistor 22 begins to increase. The gate-to-source voltage Vgs of the drive transistor 22 will soon become equal to Vsig+Vth−ΔV. That is, an increment ΔV of the source potential Vs is subtracted from the voltage held by the holding capacitance 24. In other words, the increment ΔV acts so as to discharge the charge held by the holding capacitance 24. This means that negative feedback is applied. Hence, the increment ΔV of the source potential Vs is a feedback amount of the negative feedback.

As described above, the drain-to-source current Ids flowing through the drive transistor 22 is fed back to the gate input of the same transistor 22, namely, to the gate-to-source voltage Vgs. This cancels the dependence of the drain-to-source current Ids of the drive transistor 22 on the mobility μ. That is, the mobility correction is performed to correct the variation of the mobility μ between different pixels.

More specifically, the higher the signal voltage Vsig of the video signal, the larger the drain-to-source current Ids, and therefore, the larger the absolute value of the feedback amount (correction amount) ΔV of the negative feedback. This allows for mobility correction according to the emission brightness level. Further, if we assume that the signal voltage Vsig of the video signal is constant, the larger the mobility μ of the drive transistor 22, the larger the absolute value of the feedback amount ΔV of the negative feedback. This eliminates the variation of the mobility μ between different pixels.

<Emission Period>

Figure 6D:
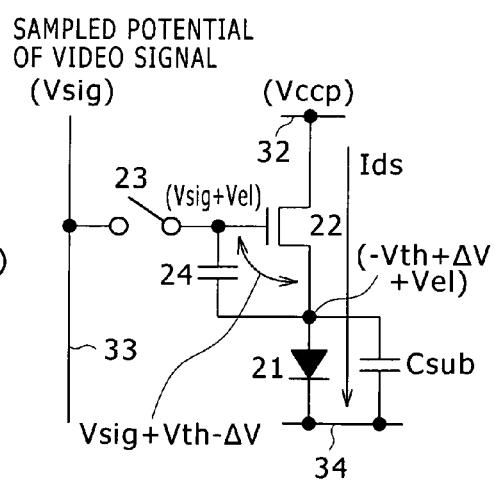

Next, the potential WS of the scan line 31 changes to the low potential at time t7. As a result, the write transistor 23 stops conducting (turns off) as illustrated in FIG. 6D. As a result, the gate of the drive transistor 22 is disconnected from the signal line 33. At the same time, the drain-to-source current Ids begins to flow into the organic EL element 21. As a result, the anode potential of the same element 21 increases with increase in the drain-to-source current Ids.

This increase in the anode potential of the organic EL element 21 is none other than the increase in the source potential Vs of the drive transistor 22. If the source potential Vs of the drive transistor 22 increases, the gate potential Vg of the same transistor 22 increases as well due to the bootstrap operation of the holding capacitance 24. At this time, the increment of the gate potential Vg is equal to the increment of the source potential Vs. Hence, the gate-to-source voltage Vgs of the drive transistor 22 is maintained constant at Vsig+Vth−ΔV during the emission period. Then, the potential of the signal line 33 changes from the signal voltage Vsig of the video signal to the offset voltage Vofs at time t8.

(Principle of the Threshold Correction)

Here, a description will be given below about the principle of the threshold correction of the drive transistor 22. The drive transistor 22 operates as a constant current source as it is designed to operate in the saturated region. This allows the drive transistor 22 to supply a constant level of the drain-to-source current (drive current) Ids, given by the following equation (1), to the organic EL element 21.

$$Ids = (1/2) * \mu (W/L) Cox (Vgs - Vth)^2 \quad (1)$$

where W is the channel width of the drive transistor 22, L the channel length and Cox the gate capacitance per unit area.

Figure 7:
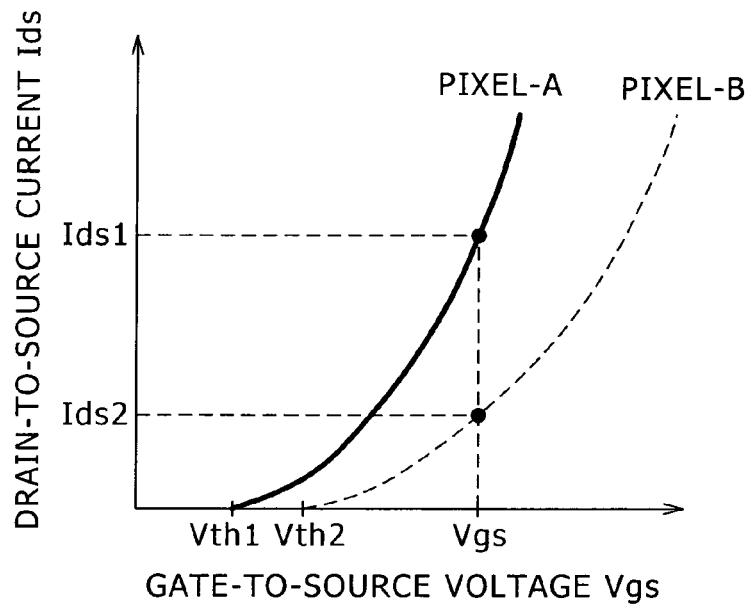
FIG. 7 is a characteristic chart for describing the problem resulting from the variation of a threshold voltage Vth of a drive transistor.

FIG. 7 illustrates the characteristic of the drain-to-source current Ids vs the gate-to-source voltage Vgs of the drive transistor 22. As illustrated in this characteristic chart, without the correction of the variation of the threshold voltage Vth of the drive transistor 22, when the threshold voltage Vth is Vth1, the drain-to-source current Ids associated with the gate-to-source voltage Vgs is Ids1. On the other hand, when the threshold voltage Vth is Vth2 (Vth2>Vth1), the drain-to-source current Ids associated with the same gate-to-source voltage Vgs is Ids2 (Ids2<Ids1). That is, if the threshold voltage vth of the drive transistor 22 changes, the drain-to-source current Ids changes as well even when the gate-to-source voltage Vgs remains constant.

In the case of the pixel (pixel circuit) 20 configured as described above, on the other hand, the gate-to-source voltage Vgs of the drive transistor 22 at the time of emission is Vsig+Vth−ΔV as mentioned earlier. By substituting this into Equation (1), the drain-to-source current Ids can be expressed by the following equation:

$$Ids = (1/2) * \mu (W/L) Cox (Vsig - \Delta V)^2 \quad (2)$$

That is, the term of the threshold voltage Vth of the drive transistor 22 is cancelled. Therefore, the drain-to-source current Ids supplied from the drive transistor 22 to the organic EL element 21 is not dependent upon the threshold voltage vth of the drive transistor 22. As a result, the drain-to-source current Ids remains unchanged even in the event of a change in the threshold voltage Vth between different pixels due to a manufacturing process variation or secular change. Hence, the emission brightness of the organic EL element 21 also remains unchanged.

(Principle of the Mobility Correction)

Figure 8:
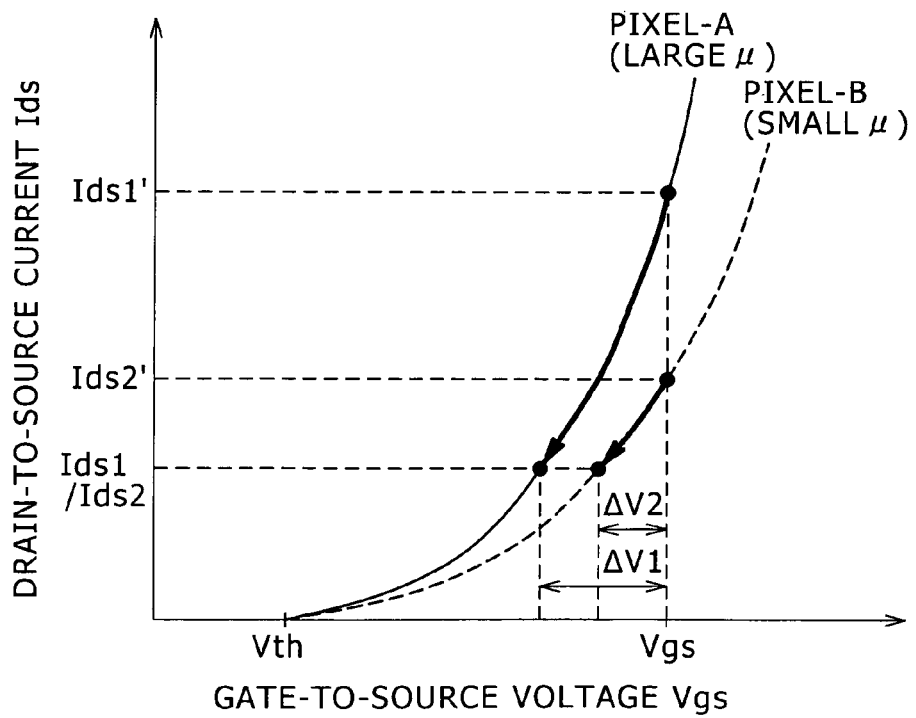
FIG. 8 is a characteristic chart for describing the problem resulting from the variation of a mobility μ of the drive transistor.

Next, a description will be given below about the principle of the mobility correction of the drive transistor 22. FIG. 8 illustrates characteristic curves comparing two pixels. One of the curves represents a pixel A whose drive transistor 22 has a relatively large level of the mobility μ. The other curve represents a pixel B whose drive transistor 22 has a relatively small level of the mobility μ. If the drive transistor 22 is, for example, a polysilicon thin film transistor, the mobility μ inevitably varies between different pixels.

We assume, for example, that the same level of the input signal voltage Vsig is written to both the pixels A and B when the mobility μ is different between the two pixels. In this case, without any correction of the mobility μ, there will be a large difference between a drain-to-source current Ids1' flowing into the pixel A with the larger mobility μ and a drain-to-source current Ids2' flowing into the pixel B with the smaller mobility μ. Thus, a large difference in the drain-to-source current Ids between pixels due to a variation of the mobility μ will impair the uniformity over the screen.

As is clear from Equation (1) relating to the transistor characteristic, the larger the mobility μ, the larger the drain-to-source current Ids. Therefore, the larger the mobility μ, the larger the feedback amount ΔV of the negative feedback. As illustrated in FIG. 8, a feedback amount ΔV1 of the pixel A with the larger mobility μ is greater than a feedback amount ΔV2 of the pixel B with the smaller mobility μ. For this reason, the mobility correction feeds back the drain-to-source current Ids of the drive transistor 22 to the input signal voltage Vsig. As a result, the larger the mobility p, the more the drain-to-source current Ids is fed back. This suppresses the variation of the mobility μ.

More specifically, if the pixel A with the larger mobility μ is corrected using the feedback amount ΔV1, the drain-to-source current Ids drops significantly from Ids1' to Ids1. On the other hand, the feedback amount ΔV2 of the pixel B with the smaller mobility μ is small. Therefore, the drain-to-source current Ids drops only from Ids2' to Ids2, which is not a significant decline. As a result, the drain-to-source current Ids1 of the pixel A becomes approximately equal to the drain-to-source current Ids2 of the pixel B, thus correcting the variation of the mobility μ.

Summing up the above, if the pixels A and B have different values of the mobility μ, the feedback amount ΔV1 of the pixel A with the larger mobility μ is greater than the feedback amount ΔV2 of the pixel B with the smaller mobility μ. That is, the larger the mobility μ of the pixel, the larger the feedback amount ΔV, and the more the drain-to-source current Ids decreases. That is, the drain-to-source current Ids of the drive transistor 22 is fed back to the input signal voltage Vsig. This provides different pixels having different levels of the mobility μ with a uniform level of the drain-to-source current Ids, thus allowing the variation of the mobility μ to be corrected.

Here, a description will be given below about the relationship between the signal potential (sampled potential) Vsig of the video signal and the drain-to-source current Ids of the drive transistor 22 in the pixel (pixel circuit) 20 illustrated in FIG. 2. The relationship will be described comparing three cases with and without the threshold and mobility corrections with reference to FIGS. 9A to 9C.

Figure 9A:
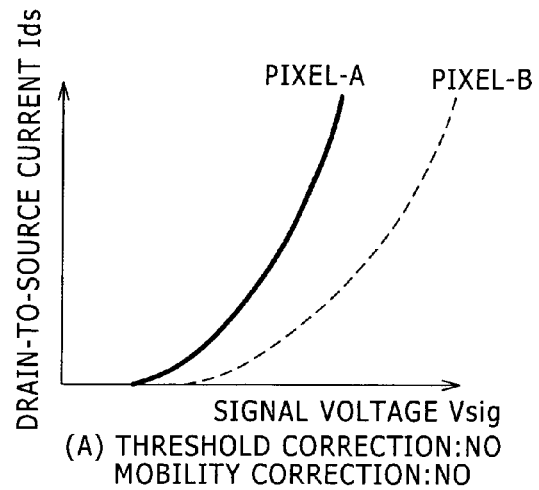
FIGS. 9A to 9C are characteristic charts for describing the relationship between a video signal voltage Vsig and a drain-to-source current Ids of the drive transistor comparing three cases with and without threshold and mobility corrections.
Figure 9B:
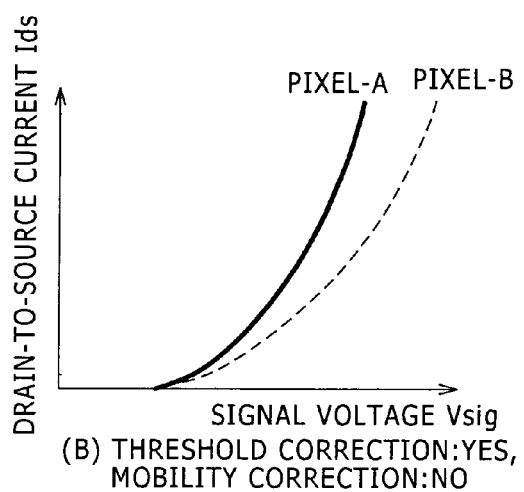
Figure 9C:
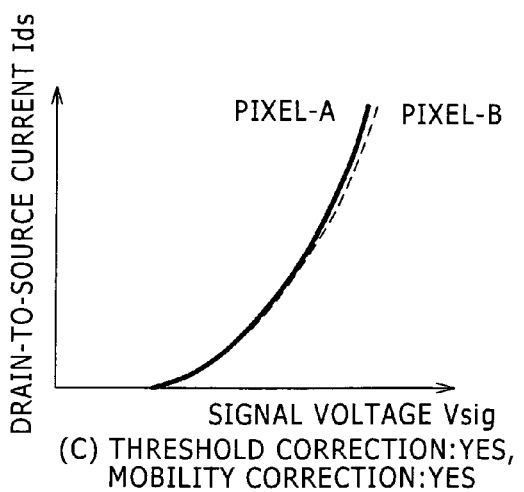

FIG. 9A illustrates the case without the threshold or mobility correction. FIG. 9B illustrates the case with the threshold correction but without the mobility correction. FIG. 9C illustrates the case with both the threshold and mobility corrections. As illustrated in FIG. 9A, if neither of the threshold and mobility corrections is performed, there is a large difference in the drain-to-source current Ids between the pixels A and B because of the variations in the threshold voltage Vth and the mobility μ between the two pixels.

In contrast, if only the threshold correction is performed, the variation of the drain-to-source current Ids can be reduced to a certain extent by this threshold correction as illustrated in FIG. 9B. However, there is still a difference in the drain-tosource current Ids between the pixels A and B attributable to the variation of the mobility μ between the two pixels. When both the threshold and mobility corrections are performed, it is possible to almost completely eliminate the difference in the drain-to-source current Ids between the pixels A and B attributable to the variations of the threshold voltage Vth and the mobility μ between the two pixels. As a result, the brightness of the organic EL element 21 remains unchanged for all shades, thus providing excellent on-screen image.

(Problems with the Mobility Correction)

Figure 10:
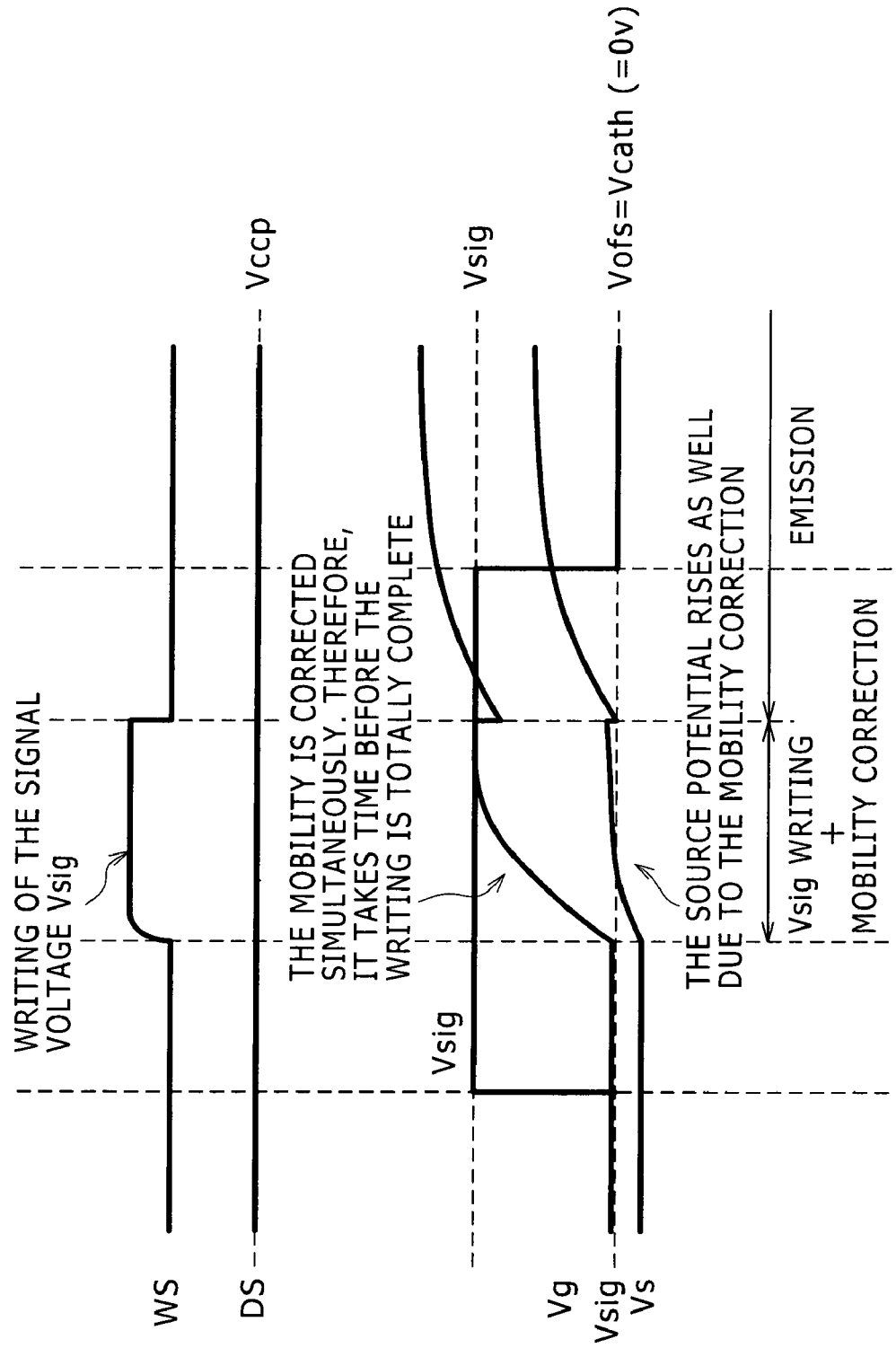
FIG. 10 is a timing diagram for describing the problem with the mobility correction.
Figure 11:
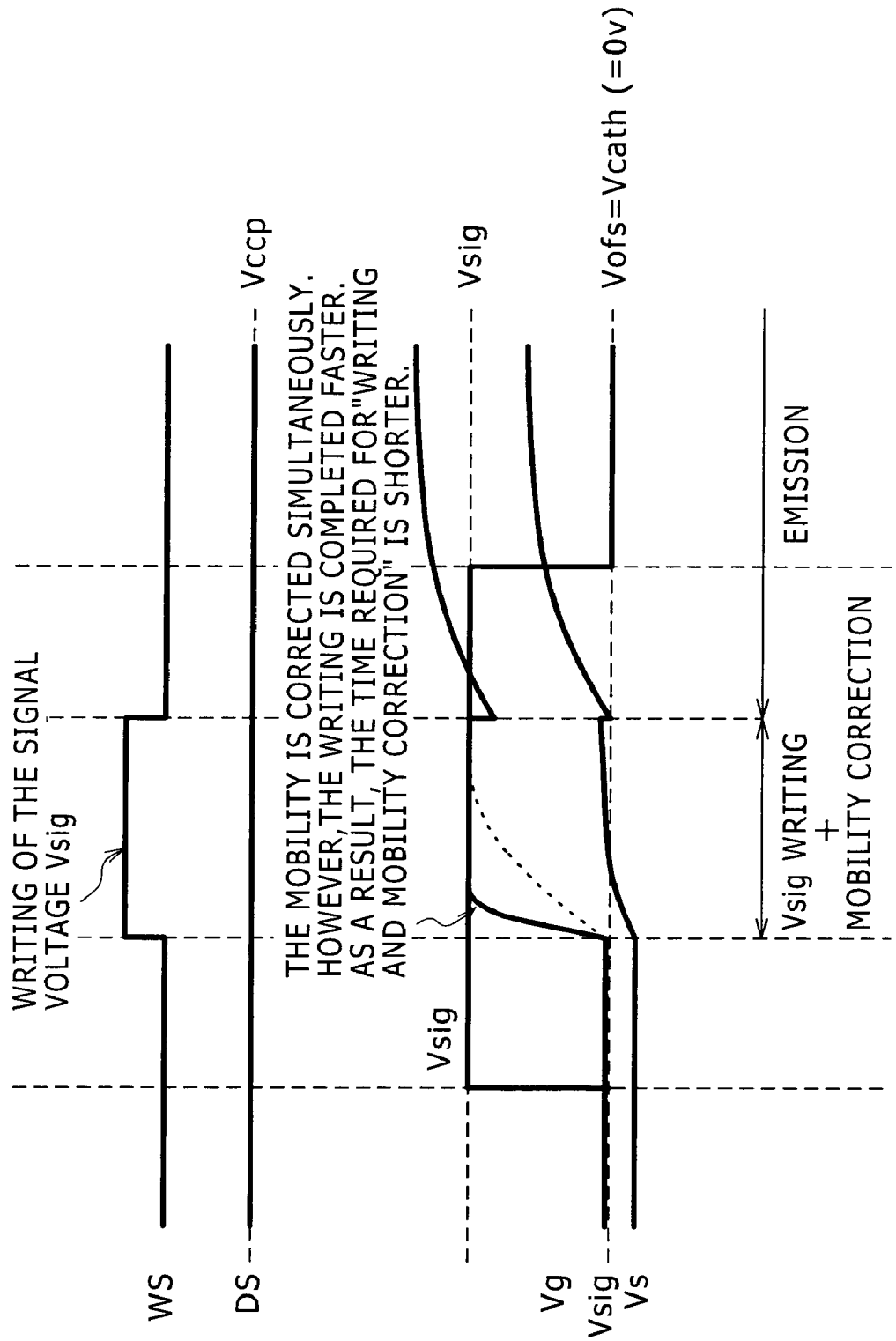
FIG. 11 is a timing diagram for describing the operation adapted to solve the problem with the mobility correction.

Here, the problems with the mobility correction will be described below with reference to the timing diagram illustrated in FIG. 10.

As is clear from the aforementioned description of the circuit operation, the mobility correction is performed simultaneously with the writing of the input signal Vsig in the pixel 20 where the drive transistor 22 serves also as a transistor adapted to control the emission and non-emission periods of the organic EL element 21. The mobility is preferably corrected when the writing of the input signal vsig is totally complete.

However, if the scan signal WS, which is output from the write scan circuit 40 to drive the write transistor 23, does not rise quickly, it takes time before the writing of the input signal Vsig is totally complete. As a result, the mobility is corrected when the writing of the input signal Vsig is still in progress.

As described above, if the mobility is corrected when the writing of the input signal Vsig is not totally complete, there is a difference in the correction amount, namely, the feedback amount ΔV of the negative feedback between a pixel with the larger mobility μ and another with the smaller mobility μ. This difference leads to a variation of the mobility correction between the two pixels, thus causing banding and degrading the image quality.

Characteristic Feature of the Present Embodiment

Therefore, the present embodiment of the present invention instantaneously activates the scan signal WS, that is, makes the leading edge steep. This reduces the time necessary to complete the writing of the input signal Vsig. As a result, although the mobility correction begins simultaneously with the writing of the input signal Vsig, the mobility is corrected when the writing thereof is totally complete. This eliminates the variation of the mobility correction between different pixels.

Embodiment 1

A description will be given below about a concrete embodiment adapted to produce a steeply rising leading edge of the scan signal WS.

Figure 12:
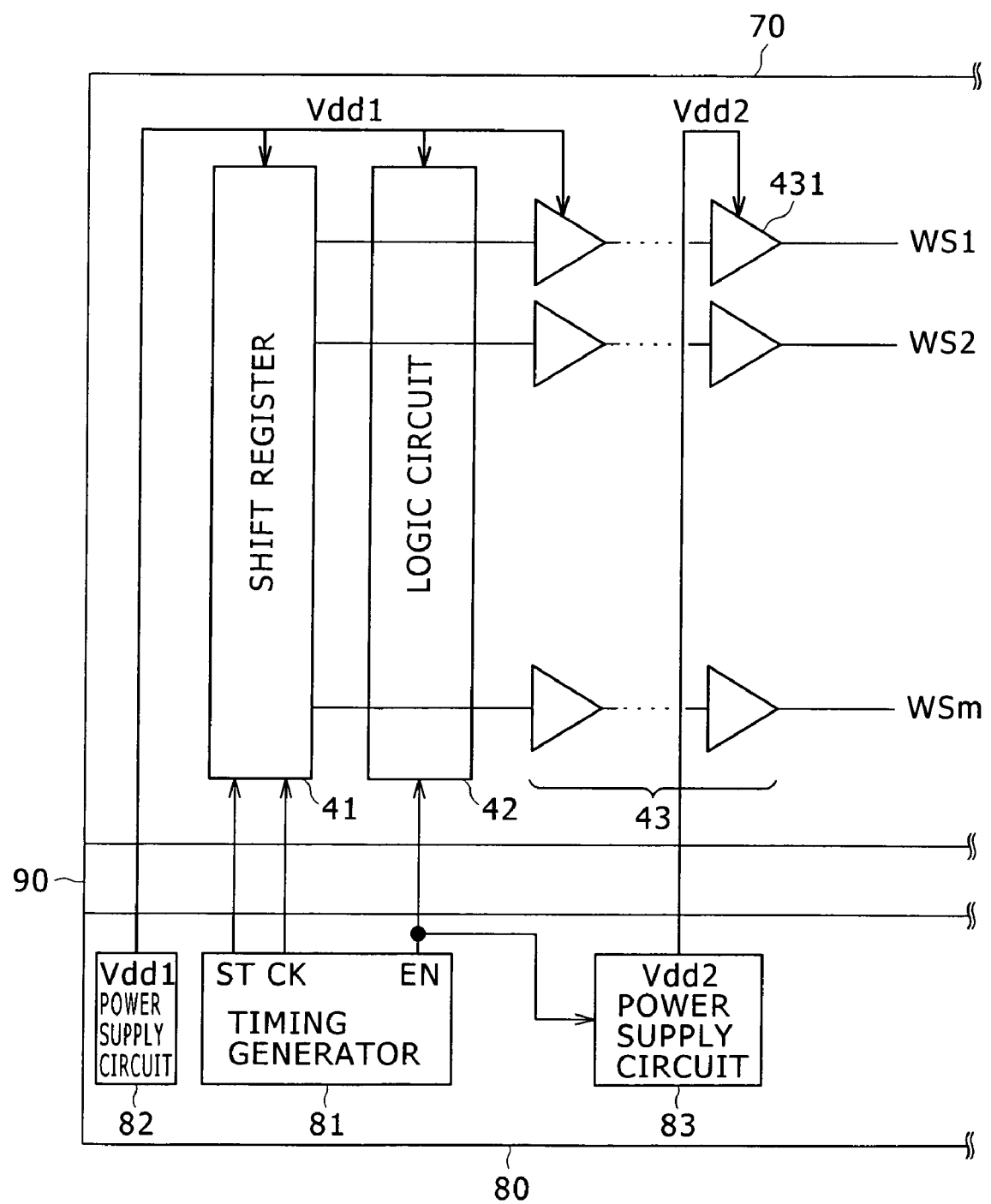
FIG. 12 is a block diagram illustrating a configuration example of a write scan circuit.

As mentioned earlier, the scan signal WS (any of WS1 to WSm) is output from the write scan circuit 40. The write scan circuit 40 includes a shift register 41, a logic circuit 42 and an output circuit 43 as illustrated in FIG. 12. The output circuit 43 includes a plurality of stages of buffers for each pixel row. The write scan circuit 40 is incorporated on the display panel 70 as a drive section adapted to drive the pixels 20 of the pixel array section 30.

The write scan circuit 40 is supplied with a timing signal and supply voltage from a control board 80 provided externally to the display panel 70, for example, via a flexible cable 90. More specifically, the control board 80 has components such as a timing generator 81, a Vdd1 power supply circuit 82 and a Vdd2 power supply circuit 83.

The timing generator 81 generates a clock pulse CK and a start pulse ST and supplies these signals to the shift register 41. The clock pulse CK serves as a reference for the operation of the shift register 41. The start pulse ST instructs the shift register 41 to initiate the shift operation. The timing generator 81 also generates an enable pulse EN and supplies this signal to the logic circuit 42. The enable pulse EN determines the pulse width of the scan signal WS.

The Vdd1 power supply circuit 82 generates a DC supply voltage Vdd1. The supply voltage Vdd1 is supplied as a positive supply voltage to the shift register 41, the logic circuit 42 and all the buffers of the output circuit 43, except for a final stage buffer 431, via the flexible cable 90.

The Vdd2 power supply circuit 83 generates a supply voltage Vdd2 in pulse form, for example, in synchronism with the enable pulse EN. The supply voltage Vdd2 is preferably set to a higher level than the supply voltage Vdd1. The supply voltage Vdd2 is supplied to the final stage buffer 431 as a positive supply voltage. The present embodiment provides the supply voltage Vdd2 in pulse form to the final stage buffer 431.

(Circuit Configuration of the Output Circuit)

Figure 13:
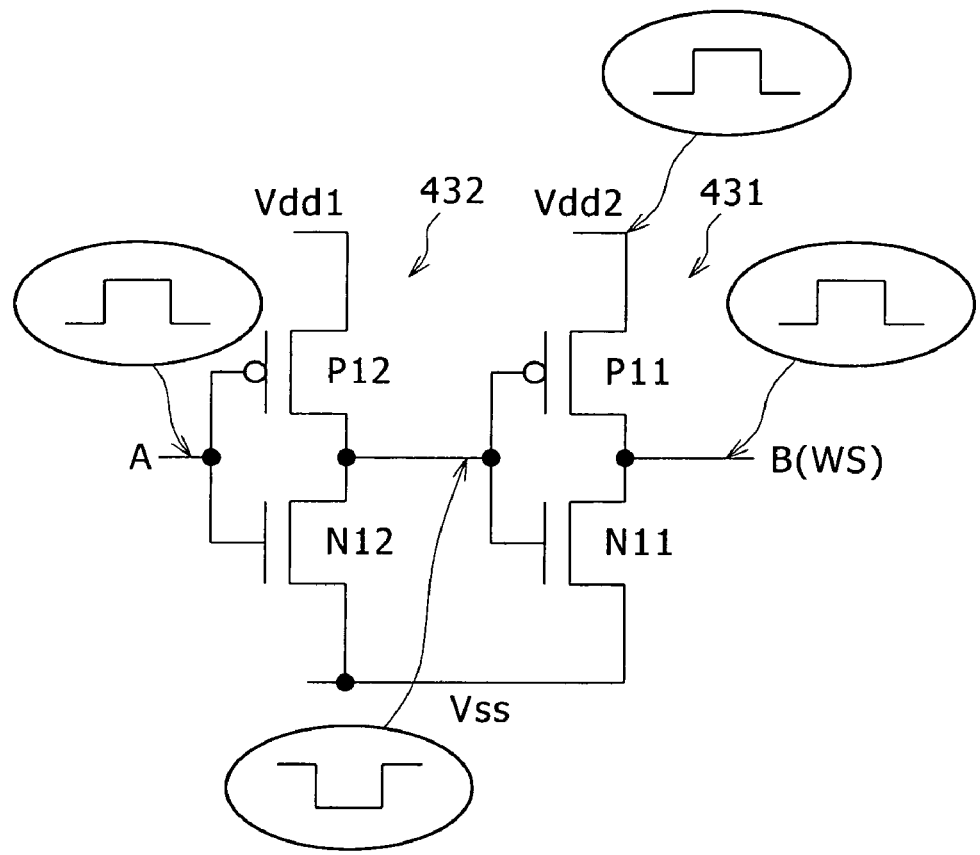
FIG. 13 is a circuit diagram illustrating a configuration example of an output circuit for a pixel row.

FIG. 13 is a circuit diagram illustrating a configuration example of the output circuit 43 for a pixel row. Here, the output circuit 43 includes two stages of buffers, namely, the final stage buffer 431 and a previous stage buffer 432. However, the present embodiment is not limited to a two-stage configuration.

The final stage buffer 431 is configured as a CMOS inverter and includes a P-channel MOS transistor P11 and an N-channel MOS transistor N11. The transistors P11 and N11 have their gates connected together and their drains connected together. The supply voltage Vdd2 in pulse form is applied to the source of the MOS transistor P11, and a DC supply voltage Vss to the source of the MOS transistor N11.

The previous stage buffer 432 is configured as a CMOS inverter and includes a P-channel MOS transistor P12 and an N-channel MOS transistor N12. The transistors P12 and N12 have their gates connected together and their drains connected together. The DC supply voltage Vdd1 is applied to the source of the MOS transistor P12, and the DC supply voltage Vss to the source of the MOS transistor N12.

(Operation of the Output Circuit)

Figure 14:
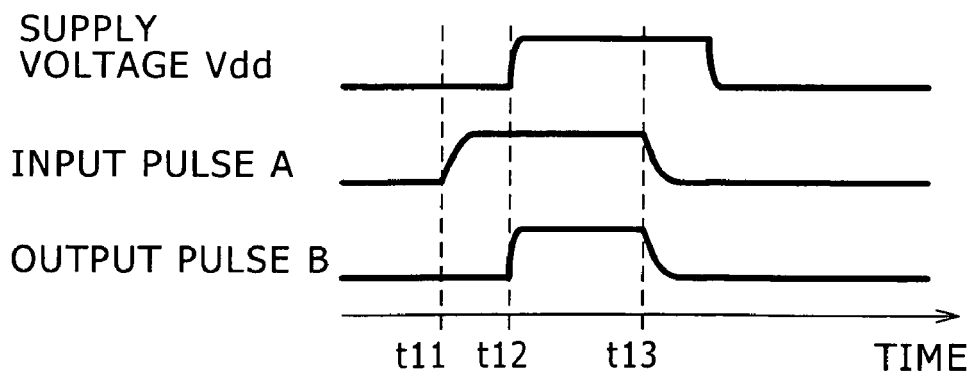
FIG. 14 is a timing waveform diagram for describing the operation of the output circuit.
Figure 15:
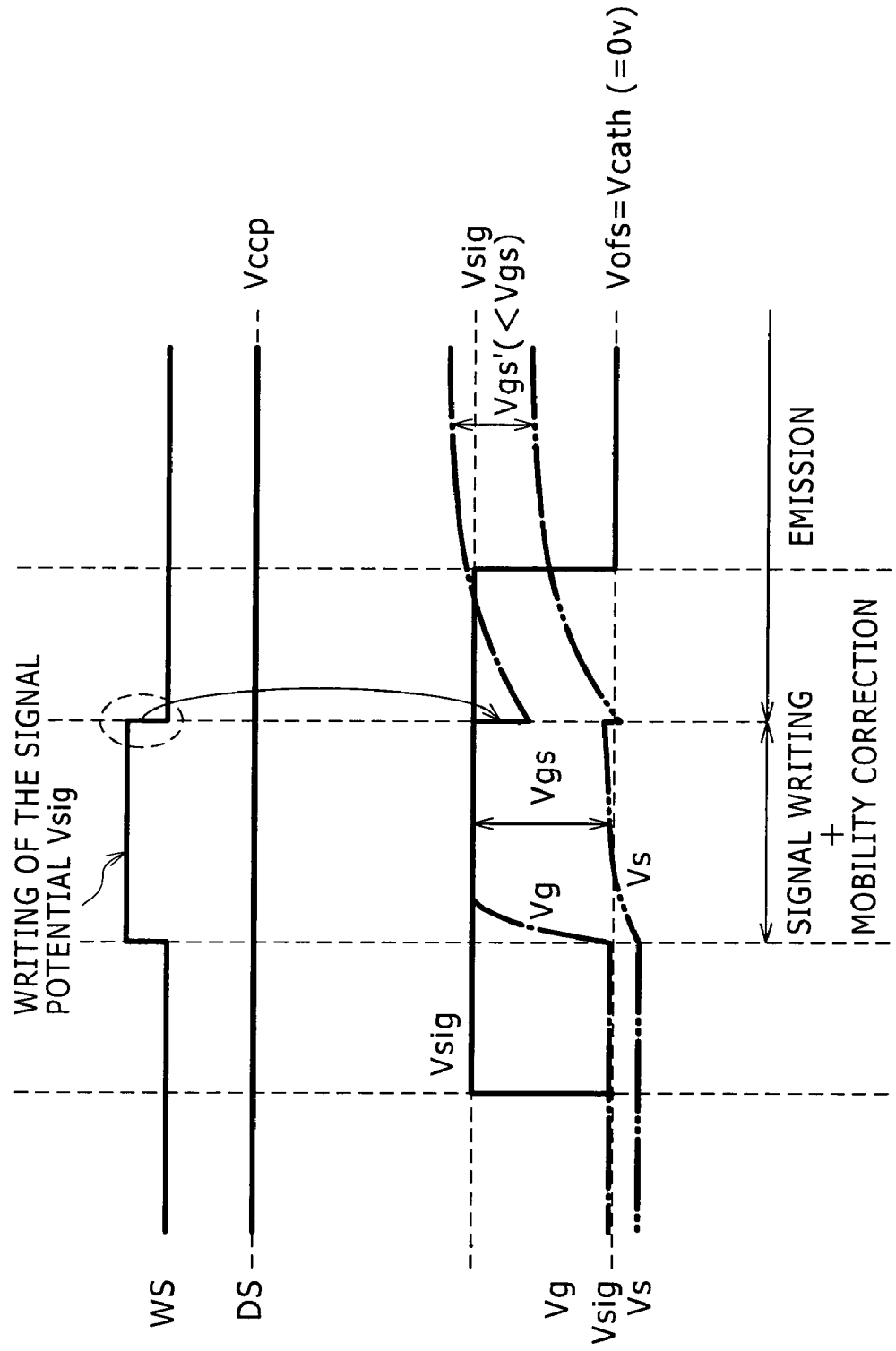
FIG. 15 is a timing waveform diagram for describing the problem when a write transistor is off.

Next, the operation of the output circuit 43 configured as described above will be described with reference to the timing waveform diagram of FIG. 14.

In the output circuit 43, a shift pulse is fed, as an input pulse A, from the shift register 41 to the previous stage buffer 432 via the logic circuit 42. The shift pulse rises at time t11 and falls at time t13. The leading and trailing edges of the input pulse A become less steep because the pulse passes through the circuit portions of the shift register 41 and the logic circuit 42. Therefore, the input pulse A has slowly sloping leading and trailing edges.

The input pulse A is inverted in polarity by the previous stage buffer 432. The same pulse A is inverted in polarity again by the final stage buffer 431 to become an output pulse B. At this time, the supply voltage Vdd2 is applied, as a positive supply voltage, to the final stage buffer 431 from the Vdd2 power supply circuit 83 provided on the control board 80 via the flexible cable 90. The supply voltage Vdd2 becomes active, that is, rises to the Vdd2 level, at time t12 in a predetermined period of time from time t11.

The supply voltage Vdd2 has no delay because it does not pass through any of the circuit portions of the display panel 70. The supply voltage Vdd2 has a steeply rising leading edge when applied to the final stage buffer 431. This ensures that, unlike the input pulse A, the supply voltage Vdd2 does not experience any reduction in steepness of the leading edge resulting from the passage of the circuit portions such as the shift register 41 and the logic circuit 42.

As described above, the output pulse B is inverted in polarity by the final stage buffer 431 operating on the supply voltage Vdd2 which has a steeply rising leading edge. Because the leading edge of the output pulse B is determined by that of the supply voltage Vdd2, the output pulse B has a steeply rising leading edge. It should be noted that the trailing edge of the output pulse B is determined by that of the input pulse A. Therefore, the output pulse B has a slowly falling trailing edge. The output pulse B is applied, as the scan signal WS, to the gate of the write transistor 23 of each of the pixels 20 in the associated pixel row.

As described above, the positive power supply of the final stage buffer 431 of the output circuit in the write scan circuit 40 is separated from the circuit portions of the previous stage. The supply voltage Vdd2 in pulse form (in square wave), which is, for example, in synchronism with the enable pulse EN, is supplied to the final stage buffer 431 as a positive supply voltage so that the output pulse B, namely, the scan signal WS, rises at the leading edge of the supply voltage Vdd2. Thanks to the steeply rising leading edge of the supply voltage Vdd2, the scan signal WS can be activated instantaneously, that is, a steeply rising leading edge of the same signal WS can be produced.

This enables reduction in time necessary for the write transistor 22 to totally complete the writing of the input signal voltage Vsig. As a result, although the mobility correction begins simultaneously with the writing of the input signal Vsig, the mobility is corrected when the writing thereof is totally complete. This eliminates the variation of the mobility correction between different pixels, thus suppressing banding and providing improved image quality.

Incidentally, if the positive power supply of the final stage buffer 431 is not separated from the circuit portions of the previous stage, and if the DC supply voltage Vdd1 is supplied to the positive power supply of the final stage buffer 431, the rise time of the output pulse B is determined by the size of the P-channel MOS transistor P11. However, the write scan circuit 40 is disposed in a confined space. Therefore, there is a limitation to increasing the size of the P-channel MOS transistor P11. This means that there is also a limitation to reducing a rise time t of the output pulse B, which is, for example, about 200 ns.

In contrast, the supply voltage Vdd2 in pulse form applied to the positive power supply of the final stage buffer 431 can be reduced in the rise time t to 100 ns or less. The rise time of the output pulse B is determined not by the size of the P-channel MOS transistor P11. Instead, the rise time thereof is equal to the rise time of the supply voltage Vdd2 in pulse form. As a result, the rise time of the output pulse B can also be reduced to 100 ns or less.

In the aforementioned embodiment, a case has been described as an example where the output pulse B of positive logic, which is active at high level, is generated as the scan signal WS. However, the present embodiment is also applicable when an output pulse B' of negative logic, which is active at low level, is generated. In this case, the negative power supply of the final stage buffer 431 of the output circuit 43 is separated from other circuit portions. Then, the supply voltage Vdd2 in pulse form is supplied, as negative supply voltage, to the final stage buffer 431. This makes it possible to provide the output pulse B' of negative logic with a steeply falling trailing edge.

Embodiment 2

A description will be given next about a concrete embodiment adapted to produce a slowly falling trailing edge of the write pulse which is adapted to write the input signal voltage Vsig (scan signal WS in the latter half).

Figure 16:
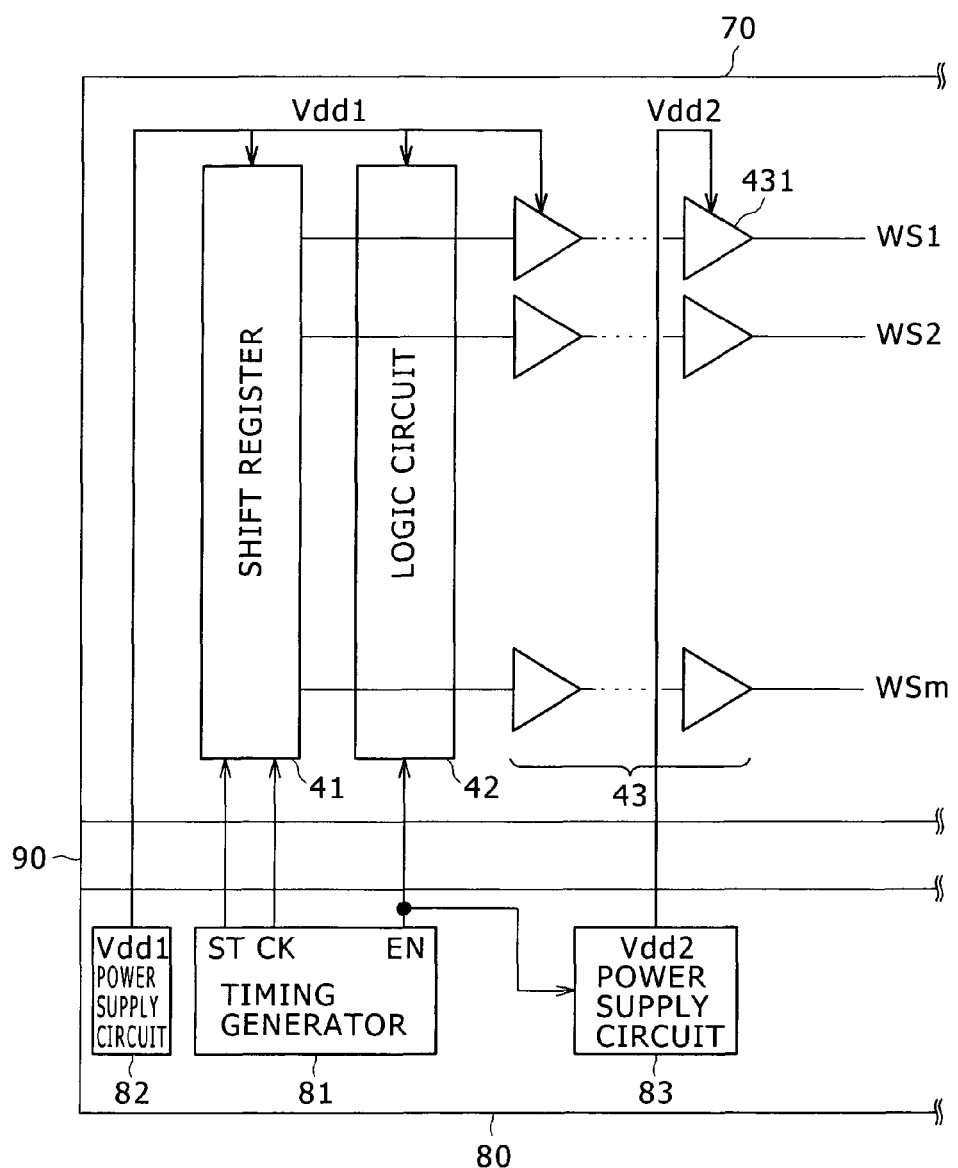
FIG. 16 is a block diagram illustrating a configuration example of the write scan circuit.

As mentioned earlier, the scan signal WS (any of WS1 to WSm) is output from the write scan circuit 40. The write scan circuit 40 includes the shift register 41, the logic circuit 42 and the output circuit 43 as illustrated in FIG. 16. The output circuit 43 includes a plurality of stages of buffers for each pixel row. The write scan circuit 40 is incorporated on the display panel 70 as a drive section adapted to drive the pixels 20 of the pixel array section 30.

The write scan circuit 40 is supplied with a timing signal and supply voltage from the control board 80 provided externally to the display panel 70, for example, via the flexible cable 90. More specifically, the control board 80 has components such as the timing generator 81, the Vdd1 power supply circuit 82 and the Vdd2 power supply circuit 83.

The timing generator 81 generates the clock pulse CK and the start pulse ST and supplies these signals to the shift register 41. The clock pulse CK serves as a reference for the operation of the shift register 41. The start pulse ST instructs the shift register 41 to initiate the shift operation. The timing generator 81 also generates the enable pulse EN and supplies this signal to the logic circuit 42. The enable pulse EN determines the pulse width of the scan signal WS.

The Vdd1 power supply circuit 82 generates the DC supply voltage Vdd1. The supply voltage Vdd1 is supplied as a positive supply voltage to the shift register 41, the logic circuit 42 and all the buffers of the output circuit 43, except for the final stage buffer 431, via the flexible cable 90.

The Vdd2 power supply circuit 83 generates the supply voltage Vdd2, for example, in synchronism with the enable pulse EN. The supply voltage Vdd2 has a slower fall time than that of a shift pulse (input pulse) fed to the final stage buffer 431 via the logic circuit 42 and the previous stage of the output circuit 43. The supply voltage Vdd2 is preferably set to a higher level than the supply voltage Vdd1. The supply voltage Vdd2 is supplied to the final stage buffer 431 of the output circuit 43 as a positive supply voltage.

As described above, in the present embodiment, the supply voltage Vdd2 has a slower fall time than that of the input pulse fed to the final stage buffer 431 (that is, the supply voltage Vdd2 has a slowly falling trailing edge), and the supply voltage Vdd2 is supplied to the final stage buffer 431 of the output circuit 43 as a positive supply voltage.

(Circuit Configuration of the Output Circuit)

Figure 17:
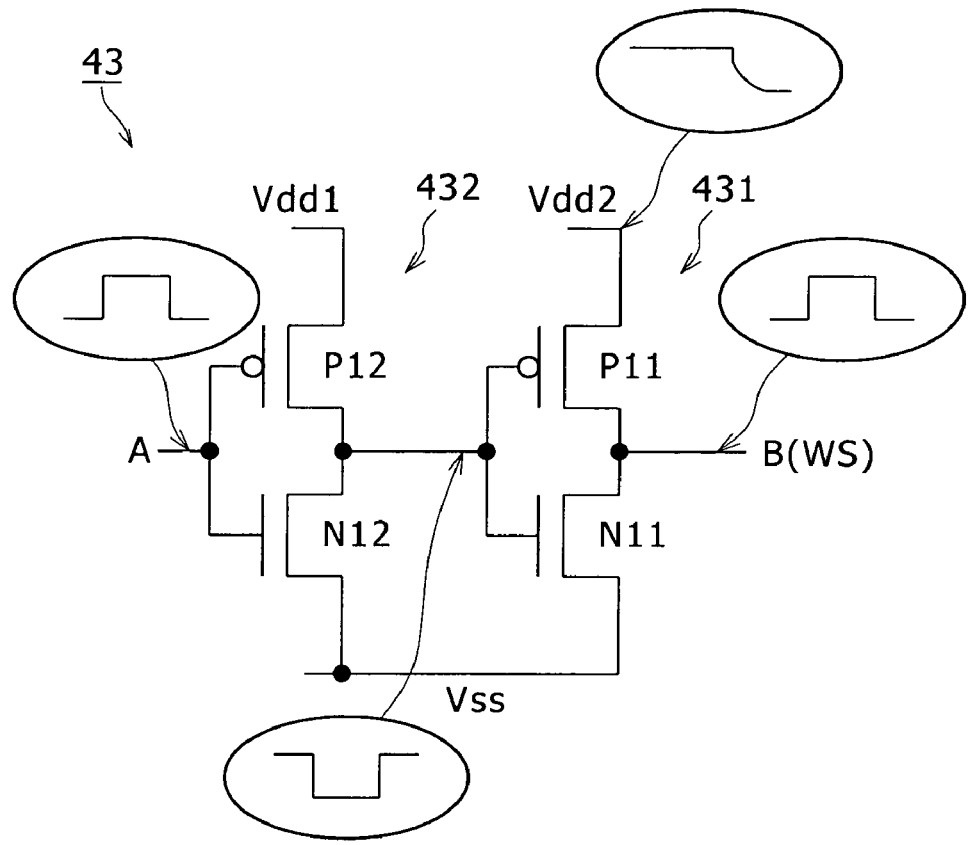
FIG. 17 is a circuit diagram illustrating a configuration example of the output circuit for a pixel row.

FIG. 17 is a circuit diagram illustrating a configuration example of the output circuit 43 for a pixel row. Here, the output circuit 43 includes two stages of buffers, namely, the final stage buffer 431 and the previous stage buffer 432. However, the present embodiment is not limited to a two-stage configuration.

The final stage buffer 431 is configured as a CMOS inverter and includes the P-channel MOS transistor P11 and the N-channel MOS transistor N11. The transistors P11 and N11 have their gates connected together and their drains connected together. The supply voltage Vdd2 having a slowly falling trailing edge is applied to the source of the MOS transistor P11, and the DC supply voltage Vss to the source of the MOS transistor N11.

The previous stage buffer 432 is configured as a CMOS inverter and includes the P-channel MOS transistor P12 and the N-channel MOS transistor N12. The transistors P12 and N12 have their gates connected together and their drains connected together. The DC supply voltage Vdd1 is applied to the source of the MOS transistor P12, and the DC supply voltage Vss to the source of the MOS transistor N12.

(Operation of the Output Circuit)

Figure 18:
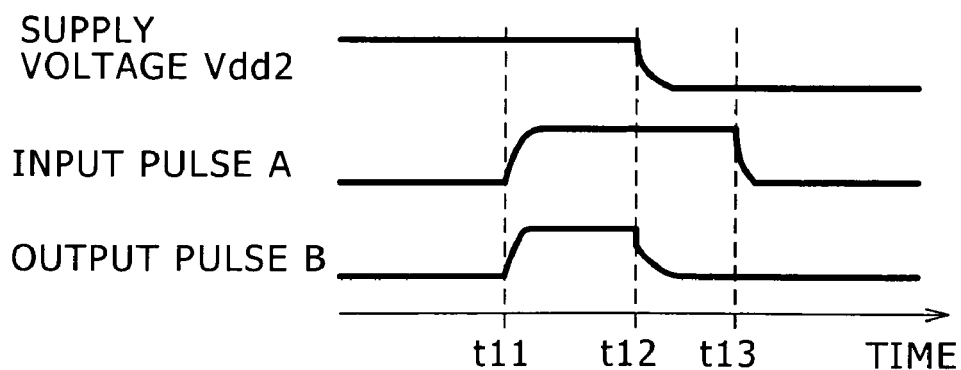
FIG. 18 is a timing waveform diagram for describing the operation of the output circuit.

Next, the operation of the output circuit 43 configured as described above will be described with reference to the timing waveform diagram of FIG. 18.

In the output circuit 43, the shift pulse is fed, as the input pulse A, from the shift register 41 to the previous stage buffer 432 via the logic circuit 42. The shift pulse rises at time t11 and falls at time t13. The leading and trailing edges of the input pulse A become less steep because the pulse passes through the circuit portions of the shift register 41 and the logic circuit 42. Therefore, the input pulse A has slowly sloping leading and trailing edges.

The input pulse A is inverted in polarity by the previous stage buffer 432. The same pulse A is inverted in polarity again by the final stage buffer 431 to become the output pulse B. At this time, the supply voltage Vdd2 is applied, as a positive supply voltage, to the final stage buffer 431 from the Vdd2 power supply circuit 83 provided on the control board 80 via the flexible cable 90. The supply voltage Vdd2 falls at time t12 and has a slower fall time than that of the input pulse A.

The supply voltage Vdd2 is supplied, as a positive supply voltage, to the final stage buffer 431. The supply voltage Vdd2 has a slower fall time than that of the input pulse A. Because the trailing edge of the output pulse B is determined by that of the supply voltage Vdd2, the output pulse B which serves as the write pulse of the input signal voltage Vsig has a trailing edge which falls more slowly than that of the input pulse A.

Effect of the Present Embodiment

Figure 19:
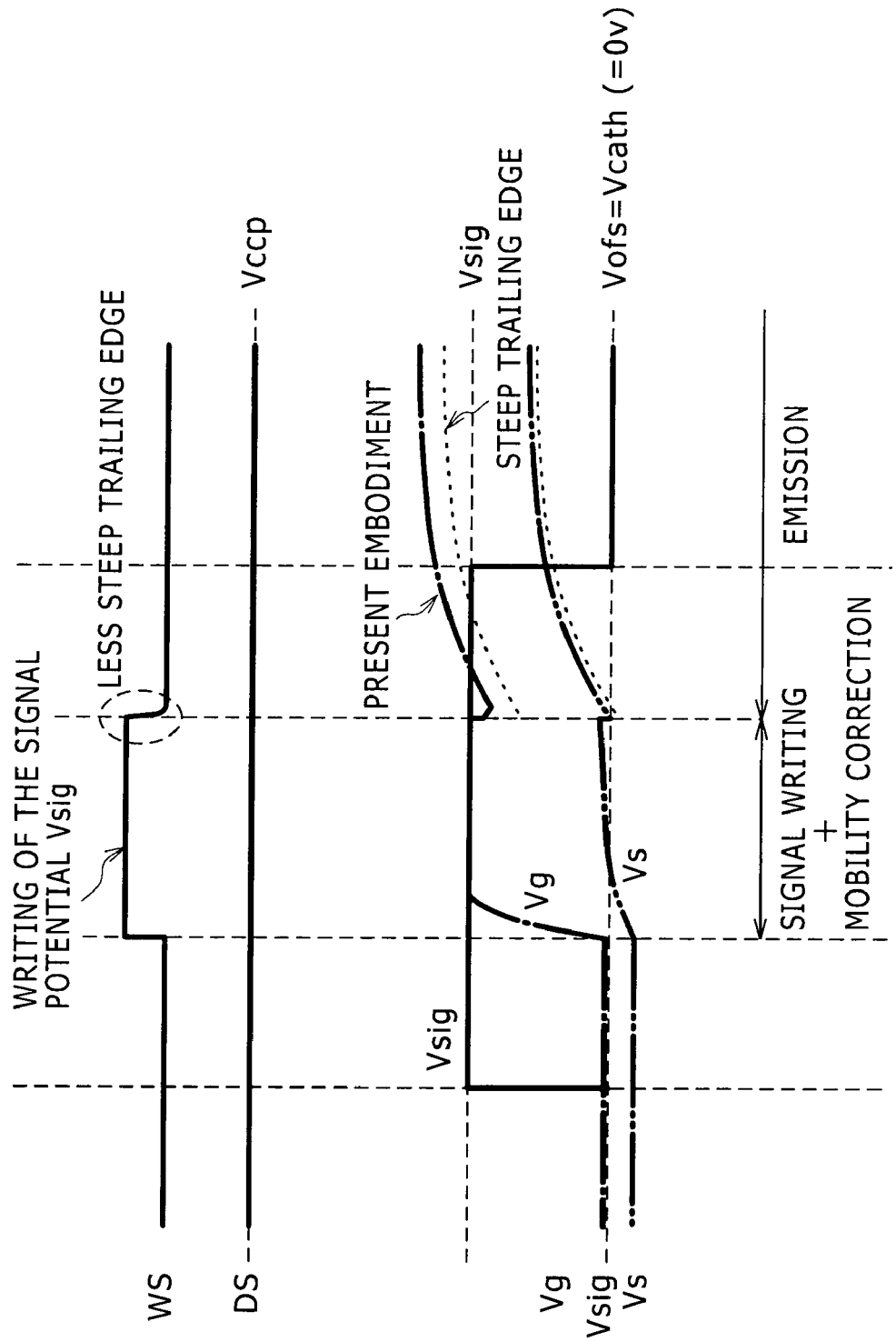
FIG. 19 is a timing waveform diagram for describing the operation when the write transistor is off.

As described above, the write pulse which is the output pulse B from the final stage buffer 431 has a slower fall time than that of the input pulse A. That is, the write pulse falls more slowly than the input pulse A (e.g., t =about 100 to 400 nsec). This suppresses the reduction of the gate voltage of the drive transistor due to reduced coupling by the holding capacitance 24 when the write transistor 23 turns off as illustrated in FIG. 19. The reduction of the gate voltage is suppressed more than when the write pulse falls as fast as the input pulse A.

This suppresses the reduction of the gate-to-source voltage Vgs of the drive transistor 22 due to coupling when the write transistor 23 turns off more than when the write pulse falls as fast as the input pulse A. As a result, the input signal voltage Vsig can be written in a stable manner while at the same time preventing the reduction of brightness resulting from the reduction of the gate-to-source voltage.

Alternatively, a slowly falling trailing edge of the write pulse can be produced (transient response can be slowed) by changing the characteristics of the circuit elements making up each of the final stage buffers 431. For example, the N-channel MOS transistor N11 may be reduced in size.

However, there is a problem with producing a slowly falling trailing edge of the write pulse on an individual basis for each of the final stage buffers 431 if there is a variation in circuit element characteristic between the different final stage buffers 431 of the write scan circuit 40. That is, this variation in characteristic leads to a variation in trailing edge waveform of the write pulse between the different final stage buffers 431 of the write scan circuit 40, possibly causing banding and degrading the image quality.

In the present embodiment, on the other hand, the fall time of the supply voltage Vdd2 is slower than that of the input pulse A fed to the final stage buffer 431. The supply voltage Vdd2 is supplied commonly to all the final stage buffers 431 of the write scan circuit 40 as a positive supply voltage. The write pulses from all the final stage buffers 431 fall at the trailing edge of the supply voltage Vdd2. This ensures that the trailing edge waveforms of the write pulses from all the final stage buffers 431 are determined exclusively by the trailing edge waveform of the supply voltage Vdd2.

This eliminates any variation in the trailing edge waveform of the write pulse between the different final stage buffers 431, thus suppressing banding resulting from the variation in waveform between the different final stage buffers 431 and providing improved image quality.

In the aforementioned embodiment, a case has been described as an example where the output pulse B of positive logic, which is active at high level, is generated as the write pulse (scan signal WS). However, the present embodiment is also applicable when the output pulse B' of negative logic, which is active at low level, is generated. In this case, the negative power supply of the final stage buffer 431 of the output circuit 43 is separated from other circuit portions. Then, the supply voltage Vdd2, whose rise time is slower than that of an input pulse A', is supplied, as negative supply voltage, to the final stage buffer 431. This provides a slowly rising leading edge of the output pulse B' (transient response of the output pulse B' can be slowed).

(Configuration of the Vdd2 Power Supply Circuit)

Figure 20:
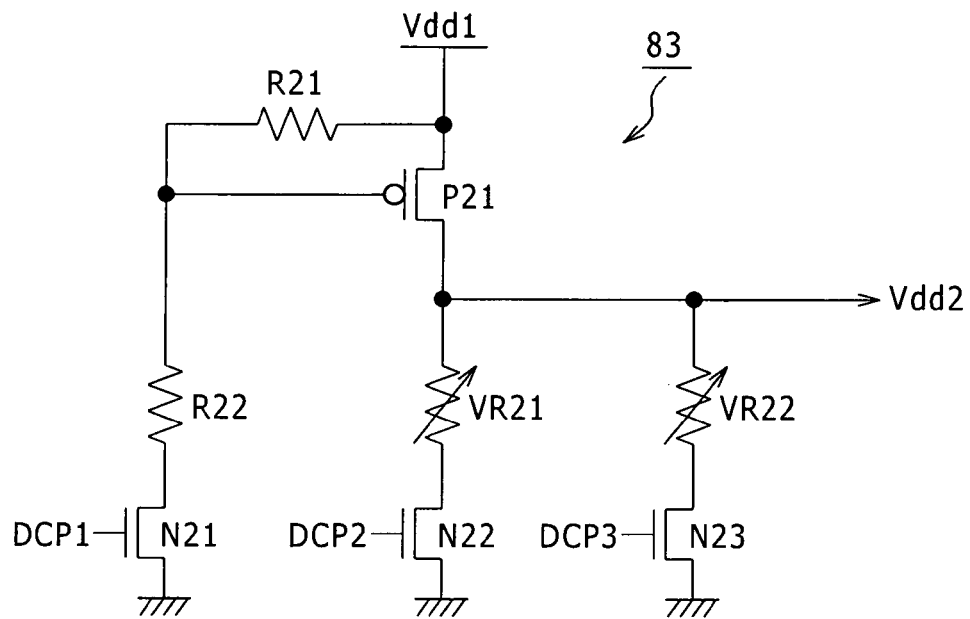
FIG. 20 is a circuit diagram illustrating a configuration example of a Vdd2 power supply circuit.

FIG. 20 is a circuit diagram illustrating a configuration example of the Vdd2 power supply circuit 83. Here, a description will be given taking, as an example, the circuit configuration adapted to generate the supply voltage Vdd2 whose trailing edge waveform has, for example, two knee points. However, the number of knee points of the trailing edge waveform is not limited to two.

As illustrated in FIG. 20, the Vdd2 power supply circuit 83 includes a P-channel MOS transistor P21, resistors R21 and R22, N-channel MOS transistors N21, N22 and N23 and variable resistors VR21 and VR22.

The P-channel MOS transistor P21 has its source connected to the power supply line of the supply voltage Vdd1. The resistor R21 is connected between the source and gate of the P-channel MOS transistor P21. The resistor R22 has one of its ends connected to the gate of the P-channel MOS transistor P21.

The N-channel MOS transistor N21 is connected between the other end of the resistor R22 and the ground which is a reference node. A first control pulse DCP1 is fed to the gate of the same transistor N21. The variable resistors VR21 and VR22 have their one ends connected to the drain of the P-channel MOS transistor P21.

The N-channel MOS transistor N22 is connected between the other end of the variable resistor VR21 and the ground. A second control pulse DCP2 is fed to the gate of the same transistor N22. The N-channel MOS transistor N23 is connected between the other end of the variable resistor VR22 and the ground. A third control pulse DCP3 is fed to the gate of the same transistor N23.

(Operation of the Vdd2 Power Supply Circuit)

Next, the operation of the Vdd2 power supply circuit 83 configured as described above will be described with reference to the timing waveform diagram of FIG. 21.

Figure 21:
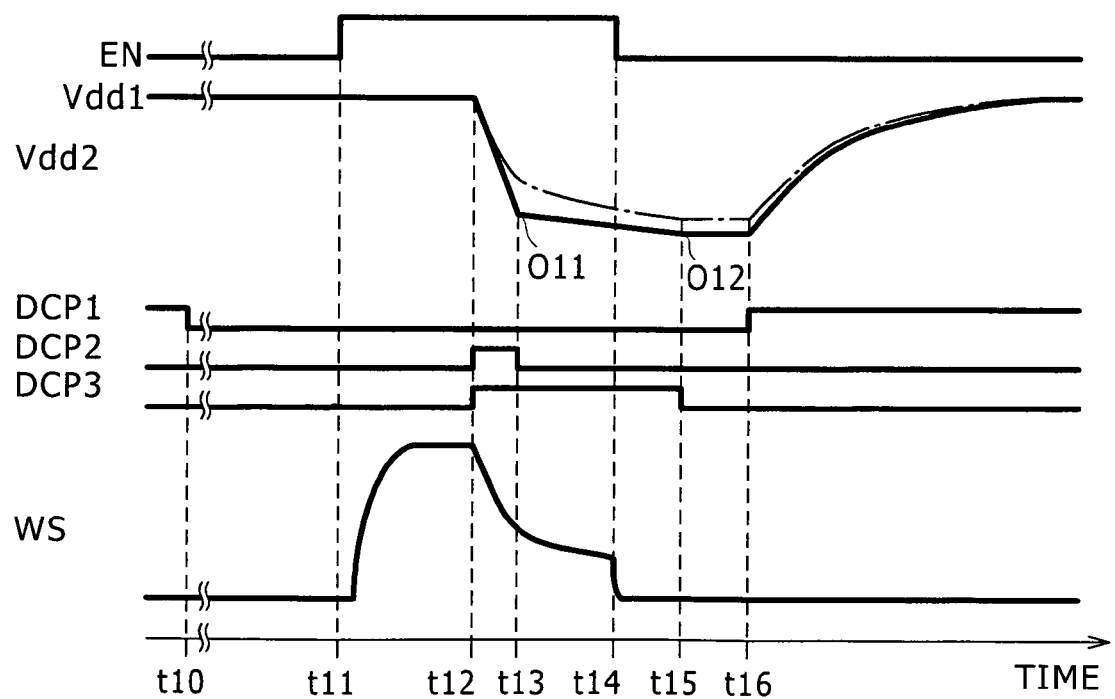
FIG. 21 is a timing waveform diagram for describing the operation of the Vdd2 power supply circuit.

FIG. 21 illustrates the timing relationship between an enable pulse EN and the first, second and third control pulses DCP1, DCP2 and DCP3 generated by the timing generator 81, and the output pulse B from the final stage buffer 431 which serves as the write pulse.

The enable pulse EN is active (high level) for a period from time t11 to time t14. The first control pulse DCP1 changes from an active to inactive state (low level) at time t10 prior to time t11. The same pulse DCP1 changes from an inactive to active state at time t16 after the elapse of the period during which the enable pulse EN is active. The second control pulse DCP2 is active for a period from time t12 to time t13 during which the enable pulse EN is active. The third control pulse DCP3 becomes active at time t12 and inactive at time t15 after the elapse of the period during which the enable pulse EN is active.

The first control pulse DCP1 is active up to time t10, keeping the N-channel MOS transistor N21 on. This also keeps the P-channel MOS transistor P21 on. As a result, the supply voltage Vdd1 is output as the supply voltage Vdd2. Here, the display panel 70 to which the supply voltage Vdd2 is supplied can be considered as a large capacitive component. Therefore, the supply voltage Vdd1 is maintained at the same level as the supply voltage Vdd2 even after the P-channel MOS transistor P21 turns off at time t10 when the first control pulse DCP1 changes from an active to inactive state.

Then, the second and third control pulses DCP2 and DCP3 become active at time t12, turning on the N-channel MOS transistors N22 and N23. At this time, the supply voltage Vdd2 falls with a time constant determined by the combined resistance of the variable resistors VR21 and VR22, the capacitive component of the display panel 70 and others.

Next, the second control pulse DCP2 becomes inactive at time t13, turning off the N-channel MOS transistor N22. As a result, only the N-channel MOS transistor N23 remains on. At this time, the supply voltage Vdd2 falls slowly from a knee point O11 with a time constant determined by the resistance of the variable resistor VR22 and the capacitive component of the display panel 70.

Next, the enable pulse EN becomes inactive at time t14. Then, the third control pulse DCP3 changes from an active to inactive state at time t15, turning off the N-channel MOS transistor N23. As a result, the supply voltage Vdd2 remains almost constant from a knee point O12.

Then, the first control pulse DCP1 changes from an inactive to active state at time t16, turning on the N-channel MOS transistor N21. At this time, the P-channel MOS transistor P21 turns on, causing the supply voltage Vdd2 to rise to the supply voltage Vdd1.

As described above, the supply voltage Vdd2 has a falling characteristic, for example, with the two knee points O11 and O12. The same voltage Vdd2 is supplied from the Vdd2 power supply circuit 83 on the control board to the final stage buffer 431 of the output circuit 43 on the display panel 70 via the flexible cable 90 in FIG. 16. At this time, the same voltage Vdd2 is affected by interconnection resistance and parasitic capacitance along the power supply path to the final stage buffer 431. As a result, the same voltage Vdd2 has a gently sloping waveform as shown by a long dashed short dashed line in FIG. 21.

Then, the supply voltage Vdd2 is supplied to the final stage buffer 431 of the output circuit 43 as a supply voltage. Further, the shift pulse from each of the stages of the shift register 41 is fed to the final stage buffer 431 as the input pulse A (refer to FIG. 18) via the logic circuit 42 while the enable pulse EN is active. This generates the output pulse B, namely, the write pulse WS, which rises at the leading edge of the input pulse A and falls at the trailing edge of the supply voltage Vdd2.

In the Vdd2 power supply circuit 83 configured as described above, the sloping angle from the start point of the trailing edge to the knee point O11 and that from the knee point O11 to the knee point O12 can be adjusted by changing the resistances of the variable resistors VR21 and VR22. This makes it possible to set the trailing edge characteristic of the supply voltage Vdd2 as desired by adjusting the resistances of the variable resistors VR21 and VR22.

Therefore, even in the event of a difference in the optimal signal write period (mobility correction period) between the different display panels 70, the trailing edge characteristic of the write pulse can be adjusted by changing the resistances of the variable resistors VR21 and VR22 for each of the different display panels 70. This makes it possible to tailor the trailing edge characteristic of the write pulse to each of the display panels 70. As a result, the optimal signal write period can be set for each of the display panels 70.

In the foregoing, a description has been made of the application of an embodiment according to the present invention to an organic EL display device in which the pixel 20 has two transistors, namely, the drive and write transistors 22 and 23, and in which the mobility is corrected simultaneously with the writing of the input signal voltage Vsig. However, the present invention is not limited to this application example. Instead, the invention is also applicable to the organic EL display device configured as described in Patent Document 1. That is, in the organic EL display device, the pixel 20 further has a switching transistor directly connected to the drive transistor 22. The switching transistor not only controls the emission and non-emission of the organic EL element 21 but also corrects the mobility ahead of the writing of the input signal voltage Vsig.

Another Effect of the Present Embodiment

It should be noted, however, that the present embodiment provides a unique effect as described below if applied to the organic EL display device 10 according to the present embodiment or others in which the mobility is corrected simultaneously with the writing of the input signal voltage Vsig.

That is, the write pulse does not have a steeply falling trailing edge as rectangular wave but a slowly falling edge. As a result, the mobility correction period can be optimized even from shades of gray to black. That is, the optimal mobility correction period can be set for each shade. This will be described in more detail below.

Figure 22:
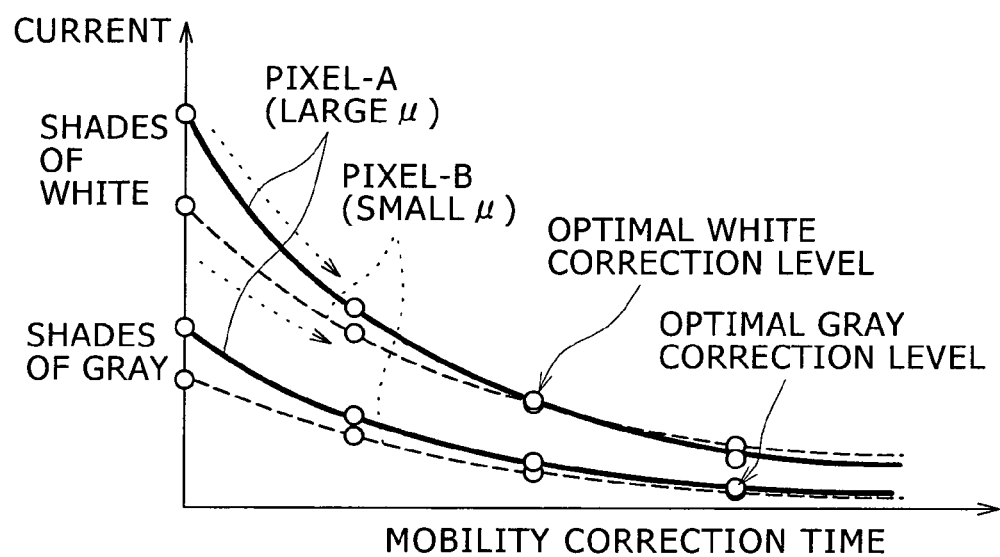
FIG. 22 is a characteristic chart for describing an optimal mobility correction time suitable for different shades.

As the input signal voltage Vsig decreases with variation of shades from white to black through gray, the optimal mobility correction time becomes longer. The reason for this is that the initial current flowing through the drive transistor 22 is smaller with shades of gray than with shades of white as illustrated in FIG. 22. Therefore, the time necessary for the mobility correction is longer with shades of gray due to the operating point of the drive transistor 22.

Here, if the mobility is corrected simultaneously with the writing of the input signal voltage Vsig, the on period of the write transistor 23 is the mobility correction period (signal write period). The write transistor 23 turns on when the difference in level between the input signal voltage Vsig and the write pulse WS exceeds the threshold voltage. Therefore, it can be said that the on period of the write transistor 23, namely, the mobility correction period, is dependent upon the trailing edge waveform of the write pulse WS.

From the above, because the write pulse WS falls slowly, the write transistor 23 turns off at a high level of the trailing edge of the write pulse when the input signal voltage Vsig is large as with shades of white. As a result, the mobility correction period is set short for shades of white. When the input signal voltage vsig is small as with shades of gray, the write transistor 23 turns off at a low level of the trailing edge of the write pulse. As a result, the mobility correction period is set long for shades of gray.

That is, in the organic EL display device 10 simultaneously handling the writing of the input signal voltage vsig and the mobility correction, the drive transistor 23 samples and writes the input signal voltage Vsig under the control of the write pulse having a slowly falling trailing edge (slow transient response). As a result, the optimal mobility correction time is different between shades of gray and white. To address this difference, the optimal mobility correction time can be set for each shade.

As described above, the optimal mobility correction time can be set for each shade. As a result, the mobility correction adapted to eliminate the variation of the mobility μ between different pixels can be performed for all shades from white to black in a reliable manner, thus providing further improved image quality.

It should be noted that, in the aforementioned embodiment, a case has been described as an example where the embodiment is applied to the organic EL display device using the organic EL elements as electro-optical elements of the pixel circuits 20. However, the present invention is not limited thereto but is applicable to display devices in general using current-driven electro-optical elements (light-emitting elements) whose emission brightness changes with change in current flowing through the elements.

APPLICATION EXAMPLES

The aforementioned display device according to an embodiment of the present invention is applicable to display devices of electronic equipment used in all fields which is designed to display the image or video of the video signal generated therein. Among such electronic equipment are a wide variety of different equipment illustrated in FIGS. 23 to 27, namely, a digital camera, laptop personal computer, mobile terminal device such as mobile phone, and video camcorder. A description will be given below about examples of electronic equipment to which an embodiment according to the present invention is applied.

It should be noted that among the display devices according to an embodiment of the present invention are those in a modular form having a sealed configuration. A display device which fits into this category is a display module formed by attaching a transparent opposed section made of glass or other material to the pixel array section 30. This transparent opposed section may have a color filter, protective film or even a light-shielding film. It should be noted that the display module may have a circuit section, FPC (flexible printed circuit) or other circuitry provided for exchange of signals between the pixel array section and external equipment.

Figure 23:
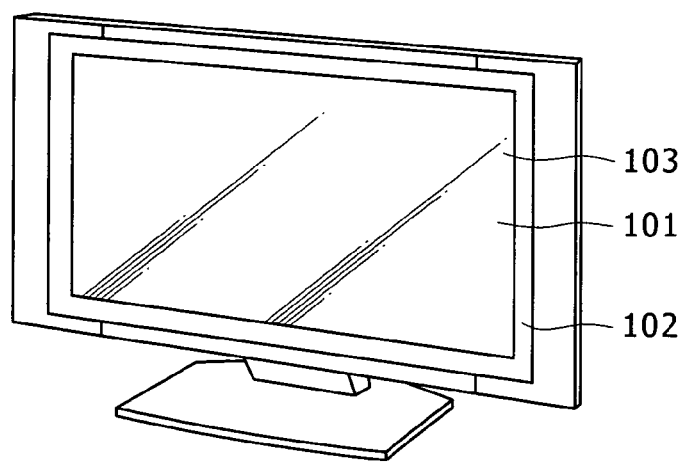
FIG. 23 is a perspective view illustrating a television set to which an embodiment according to the present invention is applied.

FIG. 23 is a perspective view illustrating a television set to which an embodiment according to the present invention is applied. The television set according to the present application example includes a video display screen section 101 which includes a front panel 102, a filter glass 103 and other components. This television set is manufactured by using the display device according to an embodiment of the present invention as the video display screen section 101.

Figure 24A:
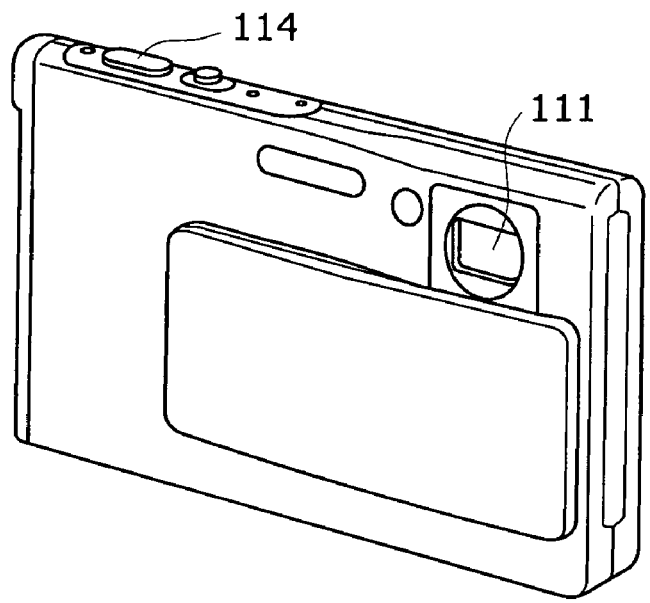
FIGS. 24A and 24B are perspective views illustrating a digital camera to which an embodiment according to the present invention is applied.
Figure 24B:
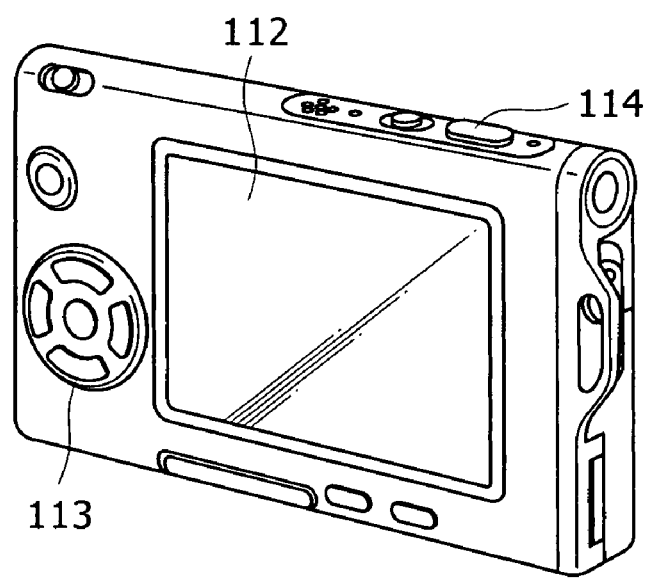

FIGS. 24A and 24B are perspective views illustrating a digital camera to which an embodiment according to the present invention is applied. FIG. 24A is a perspective view as seen from the front of the camera. FIG. 24B is a perspective view as seen from the rear thereof. The digital camera according to the present application example includes a flash light-emitting section 111, a display section 112, a menu switch 113, a shutter button 114 and other components. This digital camera is manufactured by using the display device according to an embodiment of the present invention as the display section 112.

Figure 25:
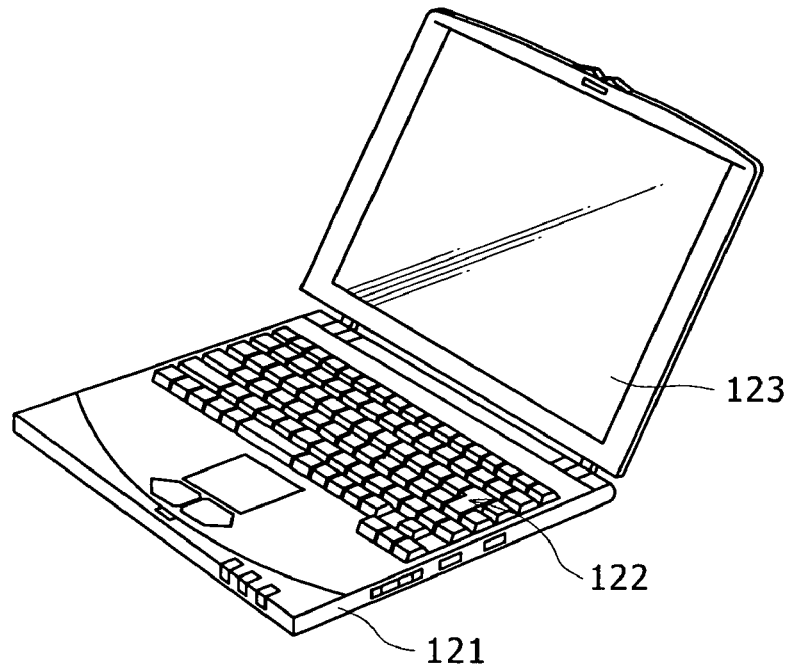
FIG. 25 is a perspective view illustrating a laptop personal computer to which an embodiment according to the present invention is applied.

FIG. 25 is a perspective view illustrating a laptop personal computer to which an embodiment according to the present invention is applied. The laptop personal computer according to the present application example includes a main body 121, a keyboard 122 adapted to be operated to enter information such as characters, a display section 123 adapted to display images and other components. This laptop personal computer is manufactured by using the display device according to an embodiment of the present invention as the display section 123.

Figure 26:
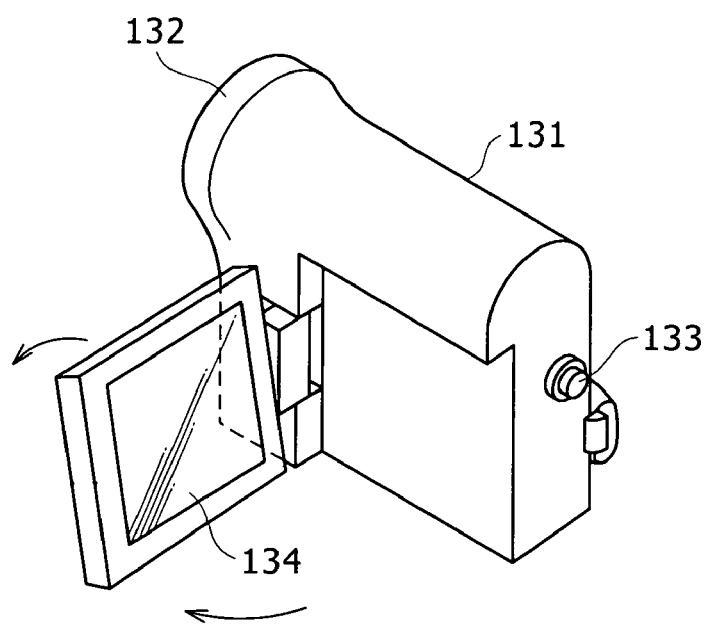
FIG. 26 is a perspective view illustrating a video camcorder to which the present invention is applied.

FIG. 26 is a perspective view illustrating a video camcorder to which an embodiment according to the present invention is applied. The video camcorder according to the present application example includes a main body section 131, a front-facing lens 132 adapted to capture the subject image, a start/stop switch 133 for image capture, a display section 134 and other components. This video camcorder is manufactured by using the display device according to an embodiment of the present invention as the display section 134.

FIGS. 27A to 27G are perspective views illustrating a mobile terminal device such as mobile phone to which an embodiment according to the present invention is applied. FIG. 27A is a front view of the mobile phone as opened. FIG. 27B is a side view thereof. FIG. 27C is a front view of the mobile phone as closed. FIG. 27D is a left side view. FIG. 27E is a right side view. FIG. 27F is a top view. FIG. 27G is a bottom view. The mobile phone according to the present application example includes an upper enclosure 141, a lower enclosure 142, a connecting section (hinge section in this case) 143, a display 144, a subdisplay 145, a picture light 146, a camera 147 and other components. This mobile phone is manufactured by using the display device according to an embodiment of the present invention as the display 144 and the subdisplay 145.

It should be understood by those skilled in the art that various modifications, combinations, sub-combinations and alternations may occur depending on design requirements and other factors insofar as they are within the scope of the appended claims or the equivalent thereof.

What is claimed is:

1. A display device comprising:
 a pixel array section including pixels arranged in a matrix form, each pixel having an electro-optical element, a write transistor adapted to sample and write an input signal voltage, a holding capacitance adapted to hold the input signal voltage written by the write transistor and a drive transistor adapted to drive the electro-optical element based on the input signal voltage held by the holding capacitance; and
 a scan circuit including a final stage buffer, whose power supply is separated from circuit portions of a previous stage, and configured to apply a scan signal from the previous stage buffer to the write transistor to select and scan the pixels in the pixel array section on a row by row basis;
 wherein a supply voltage in pulse form is supplied to the power supply of the final stage buffer so that the scan signal rises at the leading edge of the supply voltage.

2. The display device of claim 1,
 wherein each of the pixels in the pixel array section performs a correction adapted to cancel the dependence of a drain-to-source current of the drive transistor on a mobility by feeding back the drain-to-source current of the drive transistor to the gate input during the write period of the input signal voltage by the write transistor.

3. A driving method of a display device, the display device comprising:
- a pixel array section including pixels arranged in a matrix form, each pixel having an electro-optical element, a write transistor adapted to sample and write an input signal voltage, a holding capacitance adapted to hold the input signal voltage written by the write transistor and a drive transistor adapted to drive the electro-optical element based on the input signal voltage held by the holding capacitance; and
- a scan circuit including a final stage buffer, whose power supply is separated from circuit portions of a previous stage, and configured to apply a scan signal from the previous stage buffer to the write transistor to select and scan the pixels in the pixel array section on a row by row basis;
- wherein a supply voltage in pulse form is supplied to the power supply of the final stage buffer so that the scan signal rises at the leading edge of the supply voltage.

4. Electronic equipment having a display device, the display device comprising:
- a pixel array section including pixels arranged in a matrix form, each pixel having an electro-optical element, a write transistor adapted to sample and write an input signal voltage, a holding capacitance adapted to hold the input signal voltage written by the write transistor and a drive transistor adapted to drive the electro-optical element based on the input signal voltage held by the holding capacitance; and
- a scan circuit including a final stage buffer, whose power supply is separated from circuit portions of a previous stage, and configured to apply a scan signal from the previous stage buffer to the write transistor to select and scan the pixels in the pixel array section on a row by row basis;
- wherein a supply voltage in pulse form is supplied to the power supply of the final stage buffer so that the scan signal rises at the leading edge of the supply voltage.

5. A display device comprising:
- a pixel array section including pixels arranged in a matrix form, each pixel having an electro-optical element, a write transistor adapted to sample and write an input signal voltage, a holding capacitance adapted to hold the input signal voltage written by the write transistor and a drive transistor adapted to drive the electro-optical element based on the input signal voltage held by the holding capacitance; and
- a scan circuit including a final stage buffer, whose power supply is separated from circuit portions of a previous stage, and configured to apply a write pulse, which is based on an input pulse to the final stage buffer, to the write transistor to select and scan the pixels in the pixel array section on a row by row basis;
- wherein a supply voltage, whose fall time is slower than that of the input pulse, is supplied to the power supply of the final stage buffer so that the write pulse falls at the trailing edge of the supply voltage.

6. The display device of claim 5,
- wherein each of the pixels in the pixel array section performs a correction adapted to cancel the dependence of a drain-to-source current of the drive transistor on a mobility by feeding back the drain-to-source current of the drive transistor to the gate input during the write period of the input signal voltage by the write transistor.

7. The display device of claim 5,
- wherein the supply voltage is supplied commonly to all the final stage buffers of the scan circuit.

8. A driving method of a display device, the display device comprising:
- a pixel array section including pixels arranged in a matrix form, each pixel having an electro-optical element, a write transistor adapted to sample and write an input signal voltage, a holding capacitance adapted to hold the input signal voltage written by the write transistor and a drive transistor adapted to drive the electro-optical element based on the input signal voltage held by the holding capacitance; and
- a scan circuit including a final stage buffer, whose power supply is separated from circuit portions of a previous stage, and configured to apply a write pulse, which is based on an input pulse to the final stage buffer, to the write transistor to select and scan the pixels in the pixel array section on a row by row basis;
- wherein a supply voltage, whose fall time is slower than that of the input pulse, is supplied to the power supply of the final stage buffer so that the write pulse falls at the trailing edge of the supply voltage.

9. Electronic equipment having a display device, the display device comprising:
- a pixel array section including pixels arranged in a matrix form, each pixel having an electro-optical element, a write transistor adapted to sample and write an input signal voltage, a holding capacitance adapted to hold the input signal voltage written by the write transistor and a drive transistor adapted to drive the electro-optical element based on the input signal voltage held by the holding capacitance; and
- a scan circuit including a final stage buffer, whose power supply is separated from circuit portions of a previous stage, and configured to apply a write pulse, which is based on an input pulse to the final stage buffer, to the write transistor to select and scan the pixels in the pixel array section on a row by row basis;
- a supply voltage, whose fall time is slower than that of the input pulse, is supplied to the power supply of the final stage buffer so that the write pulse falls at the trailing edge of the supply voltage.

* * * * *